US012796382B2

(12) United States Patent
Sakata et al.

(10) Patent No.: US 12,796,382 B2
(45) Date of Patent: Nov. 10, 2026

(54) TRANSPORT DEVICE HAVING LOCAL PURGE FUNCTION

(71) Applicant: Rorze Corporation, Hiroshima (JP)

(72) Inventors: Katsunori Sakata, Fukuyama (JP); Yasuhisa Sato, Ibara (JP); Hidekazu Okutsu, Fukuyama (JP); Kenji Hirota, Fukuyama (JP)

(73) Assignee: RORZE CORPORATION (JP)

( * ) Notice: Subject to any disclaimer, the term of this patent is extended or adjusted under 35 U.S.C. 154(b) by 0 days.

(21) Appl. No.: 19/260,685

(22) Filed: Jul. 7, 2025

(65) Prior Publication Data

US 2025/0336699 A1 Oct. 30, 2025

Related U.S. Application Data

(62) Division of application No. 17/258,872, filed as application No. PCT/JP2018/031894 on Aug. 29, 2018, now Pat. No. 12,387,959.

(30) Foreign Application Priority Data

Jul. 13, 2018 (JP) ................................ 2018-133067

(51) Int. Cl.
*H10P 72/10* (2026.01)
*F24F 13/06* (2006.01)
(Continued)

(52) U.S. Cl.
CPC .......... *H10P 72/1924* (2026.01); *F24F 13/06* (2013.01); *H10P 72/0466* (2026.01); (Continued)

(58) Field of Classification Search
CPC ...................... H01L 21/67017; H01L 21/6793
See application file for complete search history.

(56) References Cited

U.S. PATENT DOCUMENTS 8,257,498 B2 9/2012 Yamawaku et al.
9,412,634 B2 8/2016 Segawa et al.
(Continued)

FOREIGN PATENT DOCUMENTS

CA 2043266 3/1992
CN 107068601 8/2017
(Continued)

OTHER PUBLICATIONS

International Search Report dated Nov. 27, 2018 issued in International Application No. PCT/JP2018/031894, 2 pages.
(Continued)

*Primary Examiner* — Timothy P. Kelly
(74) *Attorney, Agent, or Firm* — Merek, Blackmon & Voorhees, LLC

(57) ABSTRACT

The purpose of the present invention is to provide, at low cost, a transport apparatus 2 which is capable of transporting a semiconductor wafer W between a FOUP 19 and a processing apparatus 3 without exposing a surface to be processed of the semiconductor wafer to an oxidizing atmosphere. This transport apparatus 2 includes a load port 20 that has atmosphere replacing function, a transport robot 2 that has an atmosphere replacing function, an aligner 40 that has an atmosphere replacing function, and a load lock chamber 12 that has an atmosphere replacing function. The surface being processed of the semiconductor wafer has the atmosphere replaced locally while the semiconductor wafer is being moved and is being subjected to processes such as positioning.

9 Claims, 22 Drawing Sheets

(51) Int. Cl.
*H10P 72/00* (2026.01)
*H10P 72/76* (2026.01)

(52) U.S. Cl.
CPC ...... *H10P 72/1916* (2026.01); *H10P 72/1926* (2026.01); *H10P 72/7602* (2026.01)

(56) References Cited

U.S. PATENT DOCUMENTS

| | | | |
|---|---|---|---|
| 10,354,903 | B2 | 7/2019 | Sakata et al. |
| 2009/0028672 | A1 | 1/2009 | Yamawaku et al. |
| 2015/0170945 | A1 | 6/2015 | Segawa et al. |
| 2016/0118282 | A1 | 4/2016 | Maraschin et al. |
| 2017/0125272 | A1 | 5/2017 | van Gogh et al. |
| 2017/0204518 | A1 | 7/2017 | Yamasaki et al. |

FOREIGN PATENT DOCUMENTS

| | | |
|---|---|---|
| JP | H04243741 | 8/1992 |
| JP | 9-330972 | 12/1997 |
| JP | 2004-119627 | 4/2004 |
| JP | 2009-32877 | 2/2009 |
| JP | 2009170740 | 7/2009 |
| JP | 2013-207152 | 10/2013 |
| JP | 2013247283 | 12/2013 |
| JP | 2014-203918 | 10/2014 |
| JP | 2015-065358 | 4/2015 |
| JP | 2015-146349 | 8/2015 |
| JP | 2016-086161 | 5/2016 |
| JP | 2017108112 | 6/2017 |
| JP | 2017-128796 | 7/2017 |
| KR | 1020170054226 | 5/2017 |
| TW | 200915469 | 4/2009 |
| TW | 201528421 | 7/2015 |
| TW | 201620065 | 6/2016 |
| TW | 201628118 | 8/2016 |
| TW | 201727798 | 8/2017 |
| TW | 201739949 | 11/2017 |
| WO | WO2013/179904 | 12/2013 |

OTHER PUBLICATIONS

Extended Search Report dated Jan. 28, 2021 issued in connection with European Patent Application No. 18926100.1, five (5) pages.

Chinese Office Action dated Jan. 30, 2024 issued in connection with Chinese Patent Application No. 201880095238.3, eighteen (18) pages.

Taiwanese Office Action issued in connection with Taiwanese Patent Application No. 107129920, twenty-one (21) pages.

Korean Office Action dated Oct. 31, 2022 issued in connection with Korean Patent Application No. 10-2020-7038092, eight (8) pages.

Korean Office Action dated Oct. 21, 2023 issued in connection with Korean Patent Application No. 10-2020-7038092, eight (8) pages.

Machine translation of Chinese Office Action dated Jan. 30, 2024 issued in connection with Chinese Patent Application No. 201880095238.3.

Machine translation of Taiwanese Office Action dated Nov. 15, 2021 issued in connection with Taiwanese Patent Application No. 107129920.

Machine translation of Korean Office Action dated Oct. 31, 2022 issued in connection with Korean Patent Application No. 10-2020-7038092.

Machine translation of Korean Office Action dated Oct. 21, 2023 issued in connection with Korean Patent Application No. 10-2020-7038092.

International Preliminary Report on Patentability dated Nov. 27, 2018 issued in International Application No. PCT/JP2018/031894, 9 pages.

TRANSPORT DEVICE HAVING LOCAL PURGE FUNCTION

RELATED APPLICATIONS

The subject patent application is a divisional of U.S. patent application Ser. No. 17/258,872 filed on Jan. 8, 2021 which in turn is a national stage application of International Application No. PCT/JP2018/031894 filed on Aug. 29, 2018 which in turn claims priority from Japanese Patent Application No. 2018-133067 filed on Jul. 13, 2018. The entire contents of U.S. patent application Ser. No. 17/258,872 are incorporated herein by reference.

FIELD OF THE INVENTION

The present invention, in a transport apparatus for transporting a thin substrate such as a semiconductor wafer, relates to a transport apparatus for transporting a semiconductor wafer stored in a hermetically-sealed container called FOUP (Front Opening Unified Pod) between a processing apparatus.

BACKGROUND OF THE INVENTION

Conventionally, semiconductors have been manufactured in an environment maintained in a relatively clean atmosphere, which is called a clean room. In addition, in recent years, since miniaturization of semiconductors is progressing, it is necessary to handle semiconductor wafers in a cleaner atmosphere. Therefore, in the clean room, semiconductor wafers are sequentially transported to each processing apparatus while being stored in a FOUP whose inside is maintained in a highly clean atmosphere. In an EFEM (Equipment Front End Module) which is connected to processing apparatuses for performing various processes such as film forming or etching on a surface of a thin-plate substrate to transfer the thin-plate substrate, in order to prevent dust floating in the air from adhering on the thin-plate substrate, a space called a mini-environment space is formed to keep the atmosphere inside the apparatus exposed to the thin-plate substrate highly clean. The mini-environment space is a space surrounded by an FFU 13 (Fan Filter Unit) arranged on a ceiling of the EFEM, side walls and an air-flowable floor, and the atmosphere in the mini-environment space is cleaned by filling with the air cleaned by the FFU 13. Further, since the filled clean air is discharged out of the mini-environment space through the air-flowable floor, dust generated in the space is also discharged out of the space with a stream of clean air. By this method, by providing high cleanliness only in the space where semiconductor wafers and the like move, it has become possible to improve the yield of semiconductor products at a relatively low cost as compared to highly cleaning the entire clean room.

However, in recent years, since miniaturization of circuit line widths has progressed rapidly, problems that cannot be addressed by conventional mini-environmental systems alone for high cleanliness have emerged. In particular, there is a problem that the surface of the thin-plate substrate which has been surface-processed by the processing apparatus and transported to a closed container reacts with oxygen and moisture included in the air in the mini-environment space to form a natural oxide film. When the natural oxide film is formed, a circuit to be formed on the surface of the thin-plate substrate is not sufficiently formed, and as a result, there is a problem that desired operating characteristics cannot be secured. In addition, chemical substances contained in reaction gas which is used in the processing apparatus are carried into the closed container in a state of being attached onto the thin-plate substrate to contaminate other unprocessed thin-plate substrates in the closed container. This has an adverse effect on next processing step, and causes the deterioration of the yield.

In order to solve the above problems, a technology has been considered to make the concentration of oxygen and water vapor in the mini-environment space as low as possible by making the mini-environment space where a semiconductor wafer is transported as a closed space, and by filling the inside with an inert gas such as nitrogen.

Patent literature 1 discloses an EFEM 1 that supplies an inert gas from a gas supply means 16 into the air drawn by the FFU 13 to supply a clean gas having a low oxygen concentration into a wafer transport chamber 9 as a downward flow from the FFU 13. The low-oxygen clean gas supplied into the wafer transport chamber 9 has its impurities removed by a chemical filter 14, then moves to the upper space through a gas return path 10 by a fan 15 and is again supplied into the wafer transport chamber 9 by the FFU 13. See FIG. 1. According to this, the semiconductor wafer can be moved between the FOUP and the processing apparatus without being exposed to the atmosphere containing oxygen and water vapor, and properties of the surface of the semiconductor wafer can be appropriately controlled.

PRIOR ART

Patent Literature

Patent literature 1: Japanese Patent Laid Open Publication No. 2015-146349

DISCLOSURE OF THE INVENTION

Problems to be Solved by the Invention

However, a new problem is caused by circulating the clean gas as described above. In order to prevent the surface of the semiconductor wafer W from being oxidized, the inside of the wafer transport chamber 9 needs to be maintained at an oxygen concentration of 1% or less, and the supply amount of inert gas becomes enormous, and as a result, the manufacturing cost of the semiconductor chip increases. Further, in the wafer transport chamber 9, a transport robot for transporting a semiconductor wafer between the FOUP and the processing apparatus, an automation tool such as an aligner for positioning the semiconductor wafer, and a control unit for controlling these automation tools are located. Since a low oxygen inert gas circulating in the wafer transport chamber 9 is heated by heat due to operations of the automation tool and the control unit, and heat due to the operation of the FFU 13, the temperature will rise. As a result, a motor of a drive source of the automation tool, a computer in the control unit, and the like are not cooled, thereby causing malfunction or failure. Further, in providing a cooling means for cooling the circulating low oxygen inert gas, the manufacturing cost of the EFEM 1 is increased.

The present invention has been devised to solve the above-mentioned problems, and aims to provide a transport apparatus that can transport between the FOUP and the processing apparatus at a low cost without exposing the surface of the semiconductor wafer to be processed to an oxidizing atmosphere.

Means to Solve the Problem

In order to achieve the above-mentioned object, the transport apparatus of the present invention includes a load port with an atmosphere replacing function for placing a sealable container housing a semiconductor wafer and for replacing the inside of the container with an inert gas atmosphere, a transport robot with an atmosphere replacing function for holding the semiconductor wafer and for replacing the atmosphere of the surface to be processed of the semiconductor wafer, and an aligner with an atmosphere replacing function for holding the semiconductor wafer and for replacing the atmosphere of the surface to be processed of the semiconductor wafer, wherein the semiconductor wafer is transported while the atmosphere on the surface to be processed of the semiconductor wafer is replaced with a clean inert gas atmosphere. With the above configuration, since the surface to be processed of the semiconductor wafer can be locally replaced with an inert gas atmosphere on moving path of the semiconductor wafer, a large-scale apparatus so as to replace the whole of the atmosphere inside the transport apparatus with an inert gas is unnecessary.

The aligner with an atmosphere replacing function provided in the transport apparatus according to claim 2 of the present invention is characterized in being stored in a replacement container providing with a nozzle for ejecting the inert gas, an opening for transporting the semiconductor wafer, and a lid capable of closing the opening. According to the above configuration, it becomes possible to align the semiconductor wafer while being maintained in the inert gas atmosphere. Further, since the nozzle is provided with a filter for removing dust contained in the inert gas, it is possible to prevent the surface of the semiconductor wafer from being contaminated by impurities or dust contained in the inert gas.

Further, the aligner with an atmosphere replacing function included in the transport apparatus according to claim 4 of the present invention is characterized in including an aligner control unit, which increases the flow rate of the inert gas ejected from the nozzle while opening the opening. According to the above configuration, even when the transport robot with an atmosphere replacing function opens the lid to transport the semiconductor wafer, the atmosphere inside the aligner with an atmosphere replacing function can be maintained at a predetermined inert gas concentration.

The aligner with an atmosphere replacing function provided in the transport apparatus according to claim 5 is provided with a shower plate for ejecting the inert gas toward the surface to be processed of the semiconductor wafer held on a spindle, instead of the replacement container. According to the above configuration, the atmosphere on the surface to be processed of the semiconductor wafer can be replaced with an inert gas atmosphere without providing with any replacement container. Further, by providing with a shower plate elevating/lowering mechanism for moving the shower plate in the vertical direction, it becomes possible to eject an inert gas at a short distance from the shower plate to the surface to be processed of the semiconductor wafer. Further, the transport robot can transport the semiconductor wafer to the spindle without interfering with the shower plate.

A transport apparatus according to claim 7 of the present invention refers to the transport apparatus according to any one of claims 1 to 6, being characterized in further including a buffer tool with an atmosphere replacing function, wherein the buffer tool with an atmosphere replacing function includes a nozzle for ejecting the inert gas, an opening arranged at a position corresponding to a shelf plate on which the semiconductor wafer is placed, and a replacement container having a lid capable of closing the opening. By providing with the buffer tool with an atmosphere replacing function, the semiconductor wafer can be stored in the inert gas atmosphere even if a waiting time occurs on the semiconductor wafer due to factors such as the processing apparatus.

A buffer tool with an atmosphere replacing function provided in the transport apparatus according to claim 8 of the present invention is characterized in including a buffer control unit for increasing the flow rate of the inert gas ejected from the nozzle while the opening is opened. According to the above configuration, even when the transport robot with an atmosphere replacing function opens the lid in order to transport the semiconductor wafer, the atmosphere inside the buffer tool with an atmosphere replacing function can be maintained at a predetermined inert gas concentration.

A buffer tool with an atmosphere replacing function provided in the transport apparatus according to claim 9 of the present invention is characterized in including a cassette on which the shelf plate is formed, a cassette elevating/lowering mechanism for moving the cassette up and down, and a cover for covering the cassette and the cassette elevating/lowering mechanism. According to the above configuration, even if the buffer tool with an atmosphere replacing function stores a large number of semiconductor wafers, the transport robot with an atmosphere replacing function can access each of the semiconductor wafers.

A buffer tool with an atmosphere replacing function included in the transport apparatus according to claim 4 of the present invention is characterized in including a shower plate above the shelf plate, wherein the shower plate ejects an inert gas onto the surface to be processed of the semiconductor wafer placed on the shelf plate. According to the above configuration, since the inert gas is evenly ejected toward the surface to be processed of the semiconductor wafer placed on the shelf, the atmosphere of the surface to be processed of the semiconductor wafer can be quickly replaced.

Further, an invention according to claim 5 of the present invention refers to the transport apparatus according to any one of claims 1 to 4. The transport apparatus is characterized in further including a load lock chamber with an atmosphere replacing function, wherein the load lock chamber with an atmosphere replacing function includes a shelf plate on which the semiconductor wafer is placed, a first opening for communicating an internal space of the load lock chamber with an atmosphere replacing function and a mini-environment space, a second opening for connecting the internal space of the load lock chamber with an atmosphere replacing function and the internal space of the transport chamber, a first lid member for closing the first opening, a second lid member for closing the second opening, and a shower plate for ejecting the inert gas. The load lock chamber with an atmosphere replacing function is for transporting semiconductor wafers between the mini-environment space and the internal space of the transport chamber, and according to the above configuration, even when the semiconductor wafer is transported through the load lock chamber with an atmosphere replacing function, the surface to be processed of the semiconductor wafer can be maintained in an inert gas atmosphere.

The invention according to claim 6 of the present invention is characterized in that the shower plate ejects the inert gas onto the surfaces to be processed of the semiconductor wafer mounted on the shelf plate. The invention according to one preferred form of the present invention refers to the transport apparatus, being characterized in that the load lock with an atmosphere replacing function is provided with the shelf plate on which the semiconductor wafer is placed in a shelf shape, wherein the shower plate is arranged above each of the semiconductor wafers placed in the shelf shape. According to the above configuration, the surface to be processed of each semiconductor wafer placed on the shelf plate can be maintained in an inert gas atmosphere.

A transport apparatus according to an alternative form of the present invention includes an FFU for supplying clean air to a mini-environment space, a load port with an atmosphere replacing function, an aligner with an atmosphere replacing function, and a buffer tool with an atmosphere replacing function, and two transport robots with an atmosphere replacing function arranged at positions facing each other with respect to the buffer tool with an atmosphere replacing function, and the buffer tool with an atmosphere replacing function is characterized in that each of the two transport robots with an atmosphere replacing function is provided with an accessible opening and a lid capable of closing the opening. According to the above configuration, the two transport robots with an atmosphere replacing function can transport the semiconductor wafer through the buffer tool with an atmosphere replacing function.

Effects of Invention

As described above, according to the present invention, the surface to be processed of the semiconductor wafer can be locally replaced with the inert gas atmosphere on the moving path of the semiconductor wafer, so that there is no need for a large-scale apparatus for replacing the entire atmosphere inside the transport apparatus with an inert gas, which can contribute to cost reduction in the semiconductor manufacturing process.

PREFERRED EMBODIMENTS OF THE INVENTION

Figure 1:
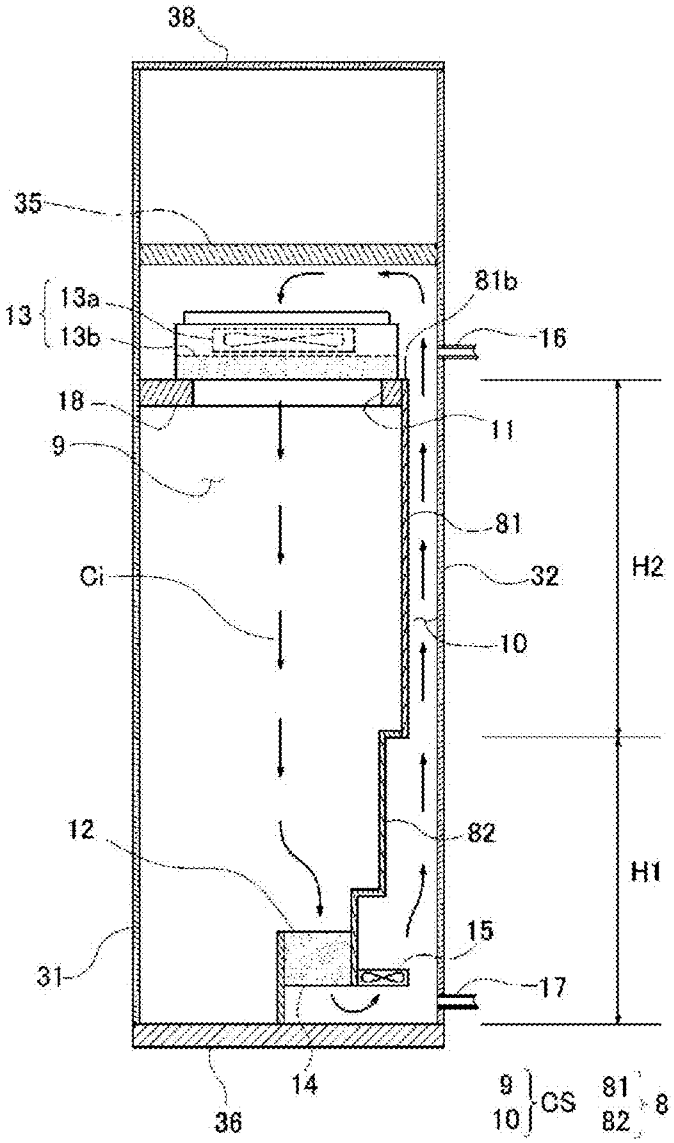
FIG. 1 is a view showing a conventional apparatus.
Figure 2:
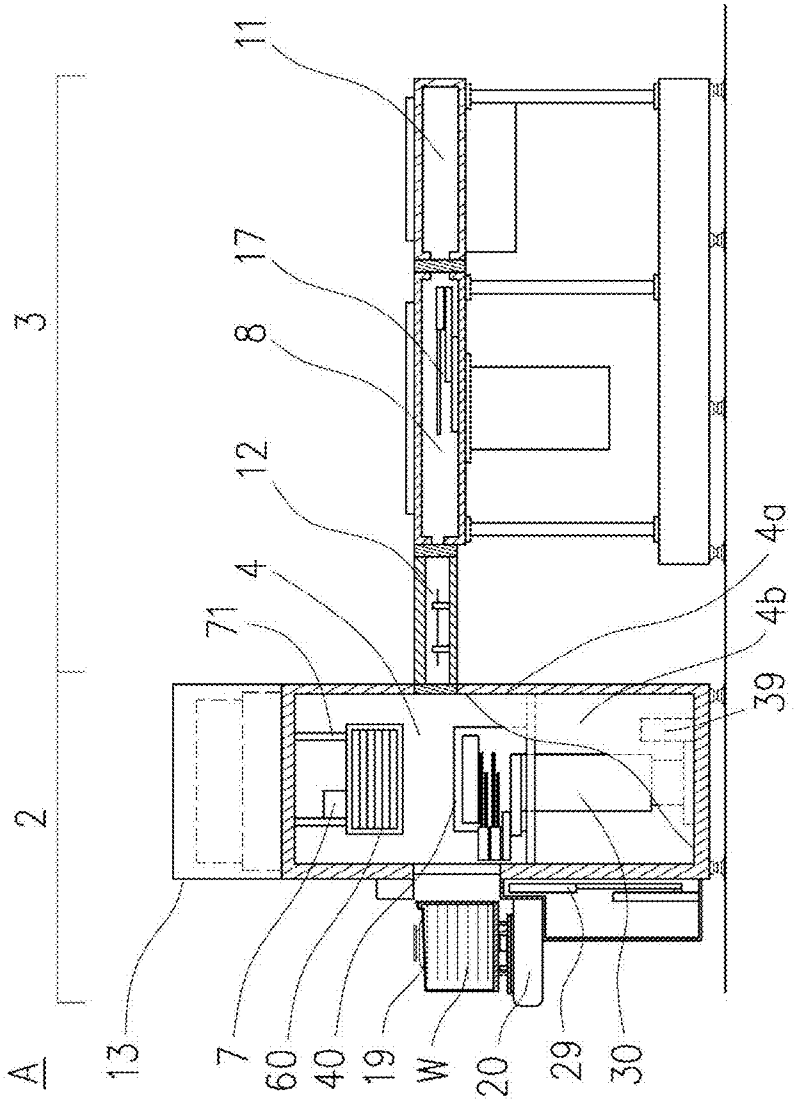
FIG. 2 is a cross-sectional view showing a processing system A of an embodiment of the present invention.
Figure 3:
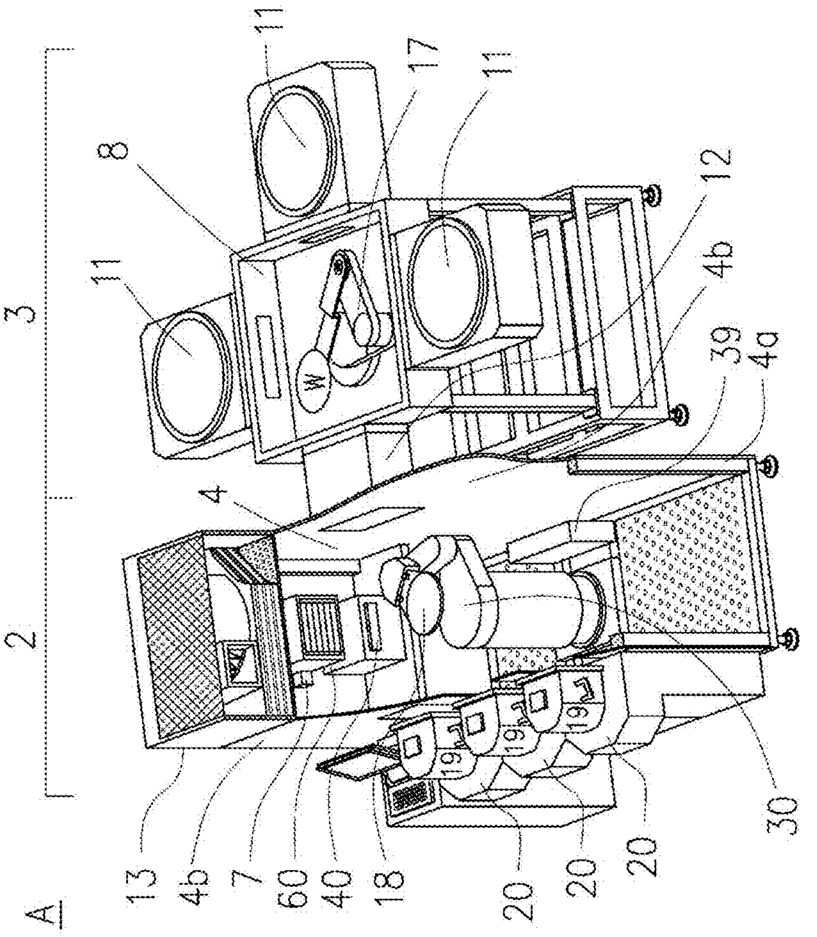
FIG. 3 is a perspective view showing the processing system A.

Hereinafter, a processing system A of an embodiment of the present invention will be described in detail with reference to the drawings. FIG. 2 is a cross-sectional view showing the processing system A of an embodiment of the present invention, and FIG. 3 is a perspective view thereof. The processing stalled in a factory called a clean room, which is controlled to a relatively clean atmosphere of about class 100 having 0.5 micrometer dust. The processing system A is generally composed of a transport apparatus 2 and a processing apparatus 3, and the transport apparatus 2 includes a frame 4*a* and a cover 4*b* forming a mini environment space 4, an FFU 13, a load port 20 with an atmosphere replacing function, a transport robot 30 with an atmosphere replacing function, and an aligner 40 with an atmosphere replacing function. A buffer tool 60 with an atmosphere replacing function is provided as necessary. Further, the processing apparatus 3 includes a transport chamber 8, a process chamber 11, a load lock chamber 12, and a vacuum transport robot 17. The mini-environment space 4 is formed by the frame 4*a*, the cover 4*b* fixed to the frame 4*a* to separate from the external atmosphere, and the FFU 13 installed on a ceiling that is a highly clean air introducing unit for introducing air from the outside into the mini-environment space 4 as a downward laminar flow after cleaning it into highly clean air. The FFU 13 includes a fan for supplying air downward toward the inside of the mini-environment space 4, and a high-performance filter for removing contaminants such as minute dust and organic substances existing in the supplied air. Further, on a floor surface of the mini-environment space 4, an air-flowable member having a predetermined opening efficiency such as a punching plate is attached.

According to the above configuration, the clean air supplied from the FFU 13 into the mini-environment space 4 flows downward in the mini-environment space 4 and is discharged from the floor surface to the outside of an apparatus. Further, dust generated by the operation of the transport robot 30 and the like is also discharged to the outside of the apparatus on this downward airflow, so that the mini-environment space 4 is maintained in a highly clean atmosphere. The transport robot 30 with an atmosphere replacing function holds a wafer W, which is a thin plate-type substrate, with fingers 18, and transports it between the FOUP 19 and the process chamber 11 while supplying an inert gas to the surface to be processed of the wafer W. The movable part of the arm of the transport robot 30 with an atmosphere displacement function is designed to prevent dust generation, thereby minimizing adverse effects on the wafer W due to dust generation as much as possible. Further, the air pressure inside the mini-environment space 4 is maintained at a positive pressure of about 1.5 Pa above the external atmosphere, preventing the entry of contaminants and dust from the outside, so that the interior of the mini-environment space 4 is maintained at a high level of cleanliness of 0.5 μm dust, class 1 or better.

Figure 4:
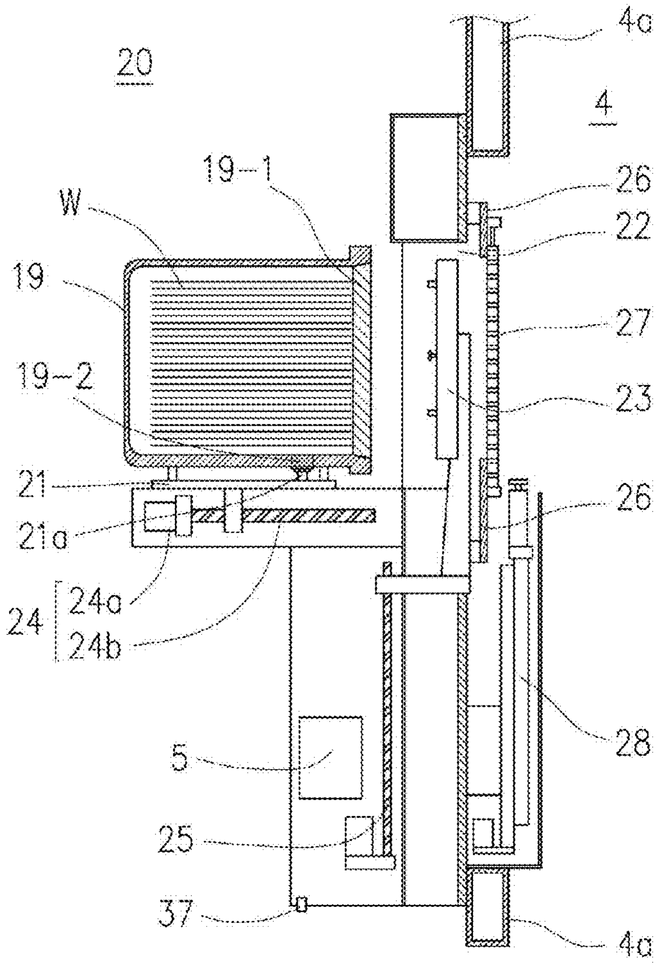
FIG. 4 is a cross-sectional view showing an outline of a load port 20 with an atmosphere replacing function which is an embodiment of the present invention.

Next, an embodiment of the load port 20 with an atmosphere replacing function provided in the transport apparatus 2 of the present invention will be described. FIG. 4 is a cross-sectional view of the load port 20 with an atmosphere replacing function of the present embodiment as seen from the side surface. The load port 20 with an atmosphere replacing function (hereinafter, referred to as "load port 20") is fixed to a predetermined position of a front frame 4*a* forming the mini-environment space 4. The load port 20 includes at least a stage 21 that places a FOUP 19 which is a closed container for housing the wafer W at a predetermined position, a port opening 22 having an area through which the wafer W can pass, a FIMS door 23 that is capable of closing the port opening 22 and is integrated with a lid 19-1 of the FOUP 19 to open and close the lid 19-1, a stage drive unit 24 that supports the stage 21 and moves the stage 21 forward and backward with respect to the FIMS door 23, and a FIMS door elevating/lowering unit 25 for moving the FIMS door 23 up and down. Further, the stage 21 also includes a positioning member (not shown) for placing the FOUP 19 at a predetermined position, and a fixing means (not shown) for fixing the placed FOUP 19.

The stage drive unit 24 includes a guide member for guiding the stage 21 in a horizontal direction, a ball screw mechanism 24*b* for moving the stage in the horizontal direction, and a motor 24*a* of a drive source for driving the ball screw mechanism 24*b*. The stage drive unit 24 is designed so that the stage 21 can be moved to an arbitrary position by transmitting rotational force of the motor 24*a* to the ball screw mechanism 24*b*. The stage drive unit 24 may include a cylinder that uses fluid pressure such as air pressure or hydraulic pressure instead of the motor 24*a* and the ball screw mechanism 24*b*. Further, in addition to the configuration of the known load port 20 described above, the load port 20 of the present embodiment includes a frame 26 that is arranged behind the FIMS door 23 when viewed from the stage 21, that is, on the side where the processing apparatus 3 is arranged, and shield plates 27 that are stacked so that openings formed on the frame 26 can be closed. Further, the load port 20 of the present embodiment includes a shield plate elevating/lowering unit 28 for moving the shield plate 27 in the vertical direction.

A purge nozzle 21*a* is provided on a surface of the stage 21 facing the bottom of the FOUP 19. The purge nozzle 21*a* is for supplying an inert gas into the FOUP 19 through a purge port 19-2 provided at the bottom of the FOUP 19, and is arranged at a position corresponding to the purge port 19-2. The atmosphere inside the FOUP 19 is replaced with the inert atmosphere by supplying the inert gas to the internal space of the FOUP 19 through the purge nozzle 21*a*. Further, the load port 20 of the present embodiment includes a joint 37 for connecting a pipe laid from an inert gas supply source (not shown) and a tube member (not shown) for supplying the inert gas from the joint 37 to the purge nozzle 21*a*. A filter and a solenoid valve for removing dust and impurities contained in the inert gas are provided in the middle of the tube member. The solenoid valve is electrically connected to the load port control unit 5, and the load port control unit 5 turns the solenoid valve on and off to switch the supply and stop of the inert gas into the FOUP 19. Control of the inert gas is performed according to a control program and various control data stored in advance in the load port control unit 5. The control data includes data such as a supply timing and supply time of the inert gas. Further, the load port 20 may be provided with a sensor for measuring the concentration of oxygen or the concentration of an inert gas, and the supply timing of the inert gas may be adjusted by the detection value of this sensor. The inert gas referred to in the present invention is a gas for replacing the atmosphere inside the FOUP 19, and includes nitrogen, argon, neon, krypton, and dry air.

The door opening operation performed by the FIMS door 23 on the FOUP 19 is completed by operating the FIMS door 23 integrated with the lid 19-1 of the FOUP 19 to a position separated from the FOUP 19, or by moving the stage 21 on which the FOUP 19 is placed to a position separated from the FIMS door 23 integrated with the lid 19-1 by the stage driving unit 24.

The inert gas supplied to the internal space of the FOUP 19 is prevented from flowing out by the plurality of shield plates 27 arranged near the opening of the FOUP 19. Further, when the transport robot 30 accesses the wafer W stored inside the FOUP 19, or when the transport robot 30 transfers the held wafer W into the FOUP 19, the operations are performed through an opening created by the shield plate elevating/lowering unit 28 lifting a predetermined shield plate 27 and all shield plates 27 placed above the predetermined shield plate 27 of the plurality of shield plates 27 stacked. This opening may have a minimum height dimension through which the wafer W and the finger 18 holding the wafer W can pass. In this way, by transporting the wafer W through the opening created by moving the shield plate 27 up, it is possible to minimize the outflow of the inert gas supplied into the FOUP 19 to the outside. As a result, the inside of the FOUP 19 is maintained in a predetermined inert gas atmosphere, so that no natural oxide films are formed on the surfaces of the wafers W in a standby state stored inside the FOUP 19. The control of each driving mechanism included in the load port 20 is performed by the load port control unit 5.

Figure 5:
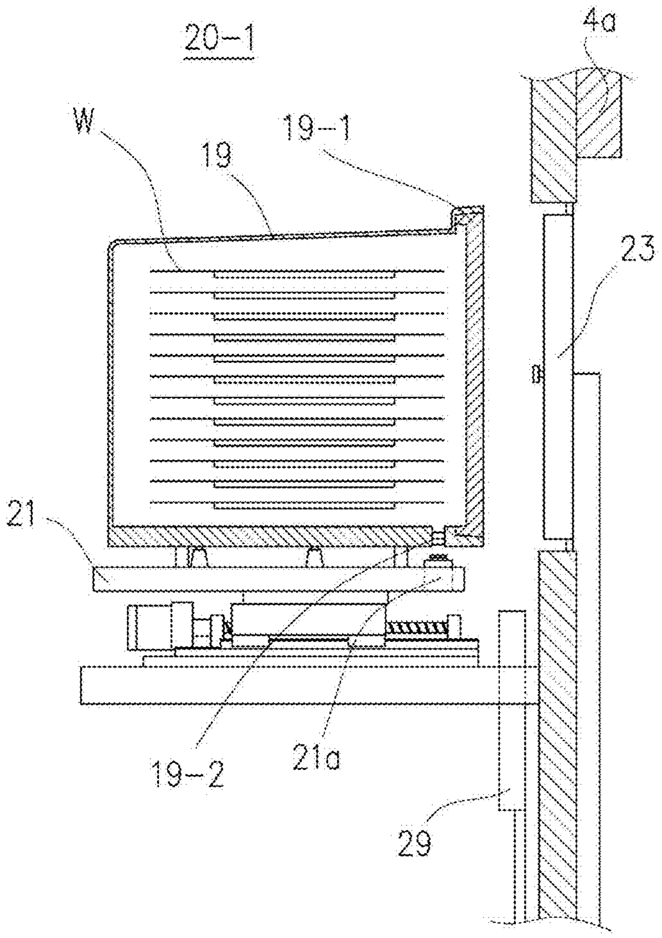
FIG. 5 is a cross-sectional view showing an outline of a load port 20-1 with an atmosphere replacing function which is an embodiment of the present invention.

As described above, the load port 20 of the first embodiment is configured to include the shield plates 27 for preventing the outflow of the inert gas, however, other embodiments are also sufficiently applicable to the present invention. FIG. 5 is a sectional view showing a load port 20-1 with an atmosphere replacing function according to other embodiments of the present invention. The load port 20-1 of the present embodiment is provided with a plate-shaped nozzle 29 for supplying an inert gas near the opening of the FOUP 19, and supplies the inert gas from the nozzle 29 to the internal space of the FOUP 19 through the opening of the FOUP 19. Thus, the atmosphere inside the FOUP 19 is replaced with an inert atmosphere. By providing a sheet-shaped filter on an inert gas blowing surface of the nozzle 29, it is possible to prevent the wafer W from being contaminated by dust adhering to the piping and joints of the inert gas supply line or impurities mixed in the inert gas.

Further, the nozzle 29 is configured to be movable up and down by the nozzle elevating/lowering means, and is configured to be positioned below the stage 21 when atmosphere replacement is not performed. Furthermore, a space for replacing atmosphere may be provided around the opening of the FOUP 19, and the atmosphere may be replaced in the entire space and the internal space of the FOUP 19.

Figure 6B:
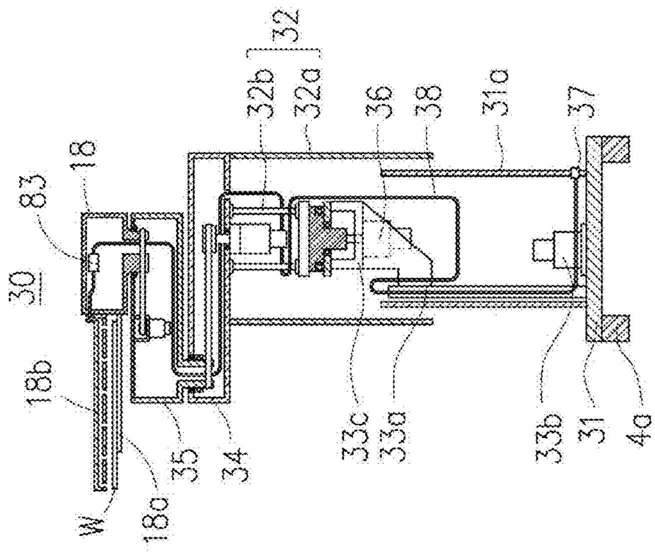
FIG. 6A and FIG. 6B are views showing an outline of a transport robot 30 of an embodiment of the present invention.
Figure 6A:
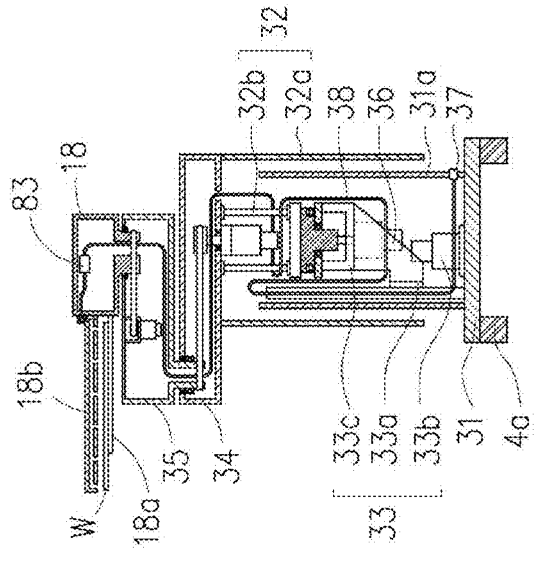

Next, an embodiment of the transport robot 30 with an atmosphere replacing function included in the transport apparatus 2 of the present invention will be described. The transport robot 30 with an atmosphere replacing function of the present embodiment (hereinafter, referred to as "transport robot 30") is arranged in the mini environment space 4, and transports the wafer W while ejecting an inert gas onto the surface to be processed of the wafer W between the FOUP 19 and the processing apparatus 3. FIGS. 6A and 6B are views showing an outline of the transport robot 30 which is an embodiment of the present invention. The transport robot 30 of this embodiment is a horizontal articulated SCARA type robot, and is a clean robot capable of preventing dust from scattering. The transport robot 30 of the present embodiment includes a base 31 fixed to a frame 4*a* arranged on the bottom of the transport apparatus 2, which is a body part 32 that can be elevated/lowered with respect to the base 31. The base 31 is provided with an elevating/lowering mechanism 33 for moving the body part 32 up and down, and the body part 32 is supported by the elevating/lowering mechanism 33 through a bracket. The elevating/lowering mechanism 33 includes a guide member for guiding the body part 32 in the vertical direction, a ball screw mechanism 33*a* for moving the body part 32 up and down, and a motor 33*b* for driving the ball screw mechanism 33*a*.

The body part 32 includes a body frame 32*a* integrally formed at the base end of the first arm 34, and a body cover 32*b* fixed to the body frame 32*a*. A second arm 35 is rotatably connected to the tip of the first arm 34 in a horizontal plane, and the first arm 34 and the second arm 35 form an arm body. The body frame 32*a* is rotatably attached to a bracket 33*c* fixed to a moving element of the ball screw mechanism 33*a* through a bearing, and is rotated in the horizontal plane by a motor 36 fixed to the bracket 33*c*. According to this, the first arm 34 integrated with the body frame 32*a* also rotates in the horizontal plane together with the body frame 32*a*. The base end of the second arm 35 is rotatably supported by the tip of the first arm (body frame) 34, and the finger 18 is rotatably supported by the tip of the second arm 35. The first arm (body frame) 34 has a hollow box-shaped housing, and therein, are arranged a motor for driving the second arm 35 and a transmission mechanism such as a pulley or a belt for transmitting the driving force from the motor. In addition, the second arm 35 has the same configuration, and therein, are arranged, a motor for driving the holding finger 18 and a transmission mechanism such as a pulley and a belt for transmitting the driving force from the motor. The motors and the transmission mechanisms for driving the first arm 34 and the second arm 35 are referred to as arm driving means.

With the above configuration, the first arm 34 and the second arm 35 connect with each other and rotate in opposite directions, whereby the arm body bends and extends, and the finger 18 arranged at the tip of the arm body is moved forward and backward. In addition, the finger 18 is rotated in a direction opposite to the rotation direction of the second arm 35 in conjunction with the rotation of the second arm 35 by operating the motor, thereby maintaining a posture facing the predetermined direction. Each of the openings of the first arm 34 and the second arm 35 is sealed by a lid so that dust generated from the pulleys, belts, etc. does not scatter to the outside.

A base cover 31*a* is attached to the inside of the body cover 32*b* with a predetermined gap so as not to contact the body cover 32*b*. The body cover 32*b* is formed such that the lower end of the body cover 32*b* is located below the upper end of the base cover 31*a* even when the body part 32 is moved up to the highest position, thereby preventing dust generated from a transmission mechanism such as a motor, a belt, and a pulley arranged on the base 31 from scattering to the outside. Further, the transport robot 30 of the present embodiment includes a joint 37 for connecting a pipe laid from an inert gas supply source (not shown), and a tube member 38 for supplying an inert gas from the joint 37 to the purge part 18*b*. A filter 83 for removing dust and impurities contained in the inert gas is arranged near the tip of the tube member 38. The filter 83 removes the dust and impurities mixed in the inert gas and supplies the inert gas to the purge part 18*b*, thereby preventing the dust and impurities from contaminating the wafer W.

Figure 7:
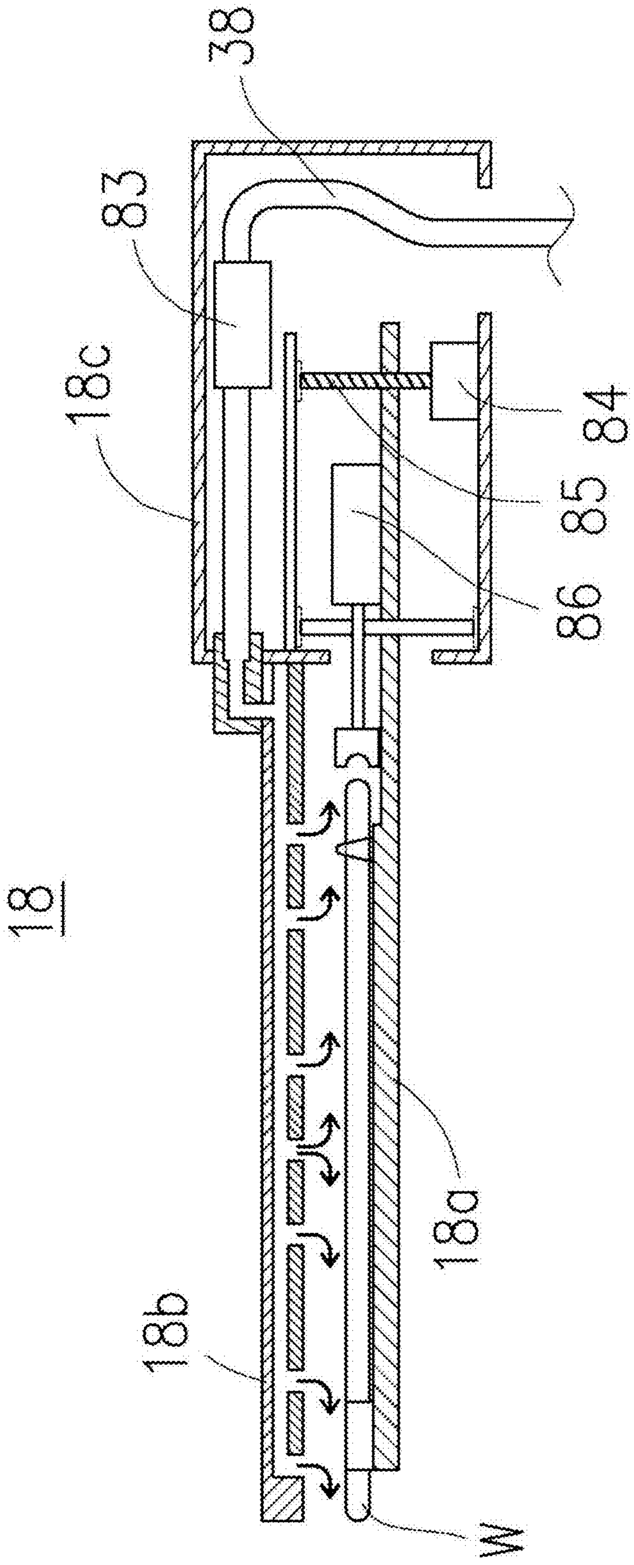
FIG. 7 is a cross-sectional view of a finger 18 provided to the transport robot 30 of the present embodiment.

Next, the fingers 18 included in the transport robot 30 of this embodiment will be described. FIG. 7 is a cross-sectional view showing the finger 18 included in the transport robot 30 of this embodiment. The finger 18 of the present embodiment includes a holding part 18*a* for holding the wafer W and a purge part 18*b* for ejecting an inert gas toward the surface of the wafer W held by the holding part 18*a*. The holding part 18*a* is provided with a known holding mechanism for holding the wafer W. The known holding mechanism includes one in which the wafer W is fixed to the holding part 18*a* by a vacuum suction force, or a mode in which the wafer W is fixed by gripping the peripheral edge of the wafer W. Further, the holding part 18*a* is provided with a known detection sensor for detecting the presence/absence of the wafer W, so that the presence/absence of the wafer W can be detected. The holding part 18*a* of the present embodiment is moved up and down by a motor 84 arranged in a main body part 18*c* of the finger 18. As the motor 84, a stepping motor whose rotation angle can be controlled is used. Further, the motor 84 is electrically connected to a control unit 39, and a shaft 85 of the motor 84 is normally rotated or reversely rotated by an electric signal from the control unit 39, whereby the holding part 18*a* screwed to the shaft 85 is moved up and down. With the above configuration, the transport robot 20 can lift up or place the wafer W from or on the FOUP 19 or other wafer placing table without operating the elevating/lowering mechanism 33, respectively.

Further, the transport robot 30 of the present embodiment may have a structure in which a suction means for sucking dust is provided inside the main body part 18*c*. By providing the suction means, dust generated from the motor 84 arranged in the main body part 18*c*, the drive source 86 of the holding mechanism for holding the wafer W and joint sections is sucked and does not flow out from the main body part 18*c*. Further, since the inside of the main body 18*c* is maintained at a negative pressure with respect to the external environment, dust is prevented from scattering outside. The suction means may be the tube member connected to a vacuum source (not shown), and the tip of the tube member is placed near the member that may generate dust.

The purge part 18*b* is located above the holding part 18*a*, and ejects the inert gas supplied from the inert gas supply source (not shown) through the tube member 38 of the transport robot 30 onto the surface to be processed of the wafer W. The purge part 18*b* is a disk-shaped member having a diameter substantially the same as the diameter of the wafer W, and has a flow passage through which the inert gas passes and an ejection port for ejecting the inert gas passing through the flow passage.

The supply and stop of inert gas is controlled by a robot control unit 39 provided by the transport robot 30, wherein the inert gas is ejected when the holding part 18*a* holds the wafer W and is stopped from ejecting when the holding part 18*a* does not hold the wafer W. The robot control unit 39 also controls the operation of each motor provided by the transport robot 30. The control of the inert gas is performed in accordance with a control program and various control data stored in advance in the robot control unit 39. The control data includes data such as a supply timing of the inert gas and a supply duration time. Further, it may be so configured that the finger 18 is provided with a detection sensor for detecting the presence or absence of the wafer W and the supply timing of the inert gas is adjusted by detection values of this sensor. Further, when the arms 34, 35 are operated to pick up the wafer W, the arms 34, 35 may be controlled to eject the inert gas before the wafer W is picked up. According to the above configuration, the transport robot 30 can continue to eject the inert gas onto the surface to be processed of the wafer W while holding the wafer W, and thereby preventing an unnecessary natural oxide film from being formed on the surface to be processed of the wafer W. In particular, when transporting the wafer W to the load lock chamber 12 which is open to the atmosphere, the wafer W is placed on the load lock chamber 12 which the oxygen concentration and the residual gas concentration are relatively high, and the inert gas can be ejected to the wafer W until the finger 18 is retracted. Therefore, it is possible to suppress the formation of a natural oxide film as compared with the conventional technique.

Figure 8A:
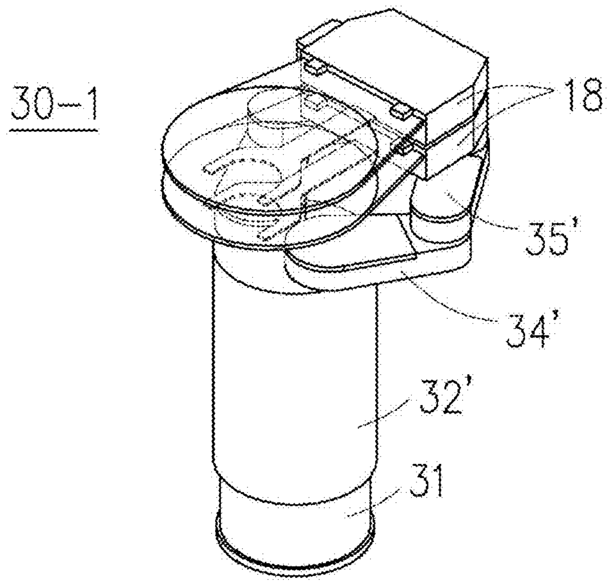
FIG. 8A and FIG. 8B are views showing an outline of a transport robot 30-1, 30-2 of an embodiment of the present invention, respectively.
Figure 8B:
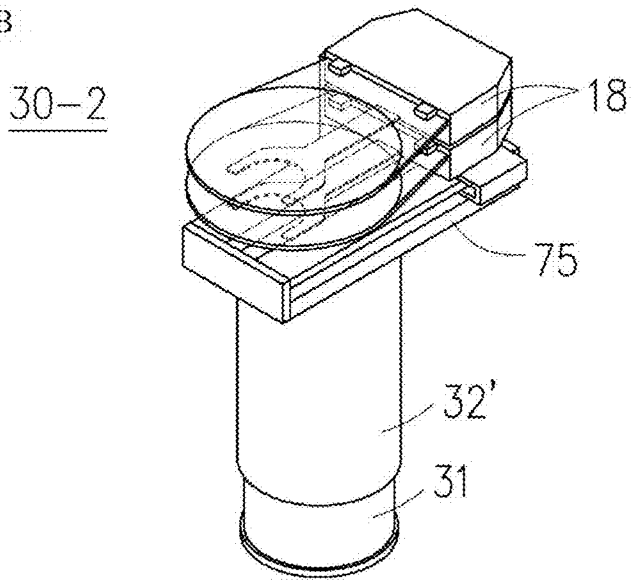

The transport robot 30 of the present embodiment is a horizontal articulated robot that drives the first arm 34, the second arm 35, and the finger 18 by individual motors, however, the present invention is not limited to this, as long as the finger 18 having the atmosphere replacing function can be accurately moved to a predetermined position. For example, it may be formed that a first arm 34' is rotatably attached to a body part 32' configured to be capable of elevating/lowering and rotating with respect to the base 31, and a second arm 35' is rotatably attached to the tip of the first arm 34', and the finger 18 is rotatably attached to the tip of the second arm 35'. See the transport robot 30-1 in FIG. 8A. The first arm 34', the second arm 35', and the finger 18 are connected to each other by a pulley and a belt at a predetermined rotation ratio, so that the driving force of one motor allows the arm body composed of the first arm 34 and the second arm 35 to perform bending and stretching operations and allows the finger 18 attached to the tip of the second arm 35' to move forward and backward on a straight trajectory. Further, it may be formed that a linear motion arm 75 configured by a ball screw mechanism is arranged on the body part 32' capable of elevating/lowering and rotating, and the finger 18 is fixed to the moving element of the linear motion arm 75. See the transport robot 30-2 in FIG. 8B.

Figure 9:
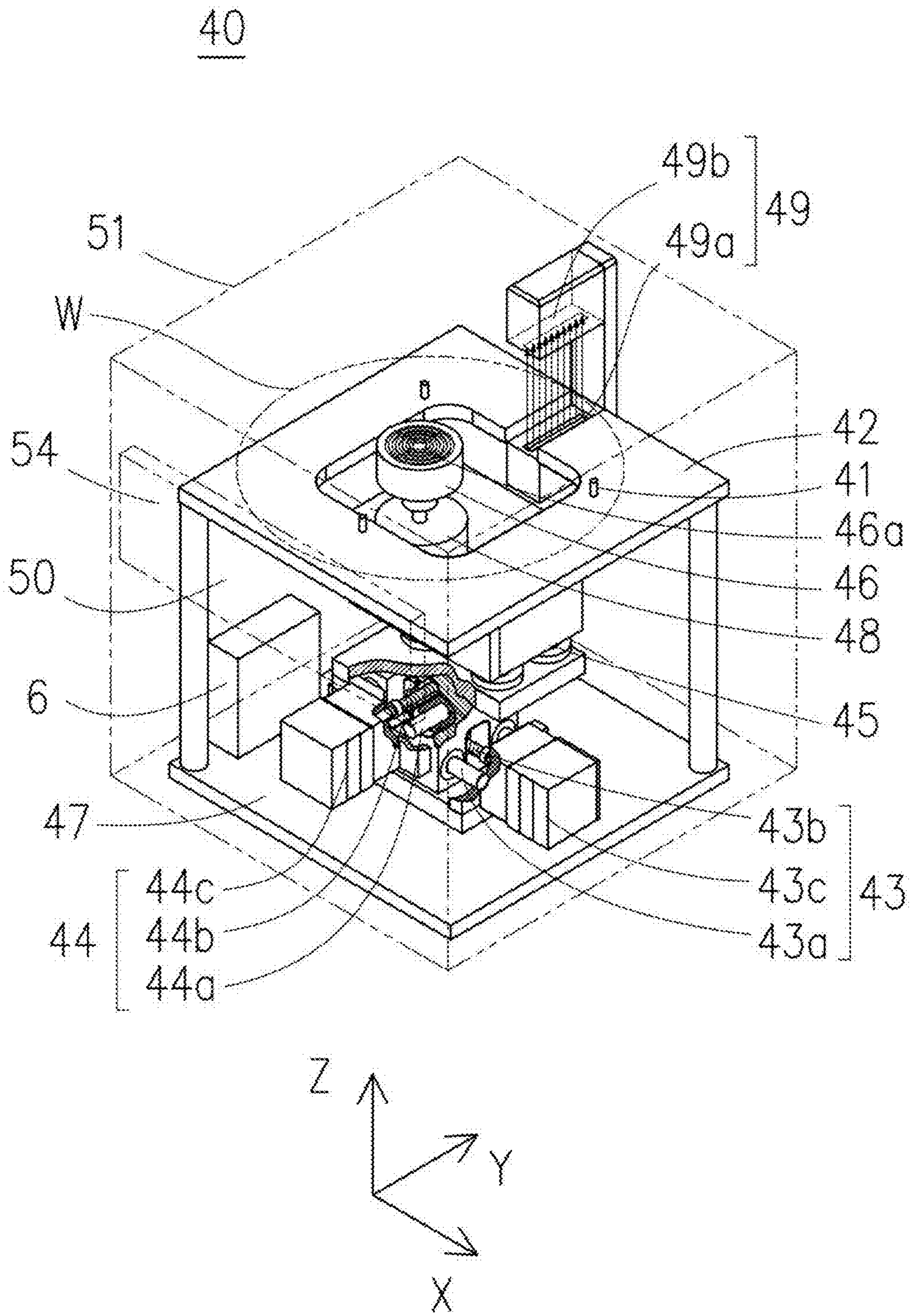
FIG. 9 is a view showing an outline of an aligner 40 of an embodiment of the present invention.
Figure 10A:
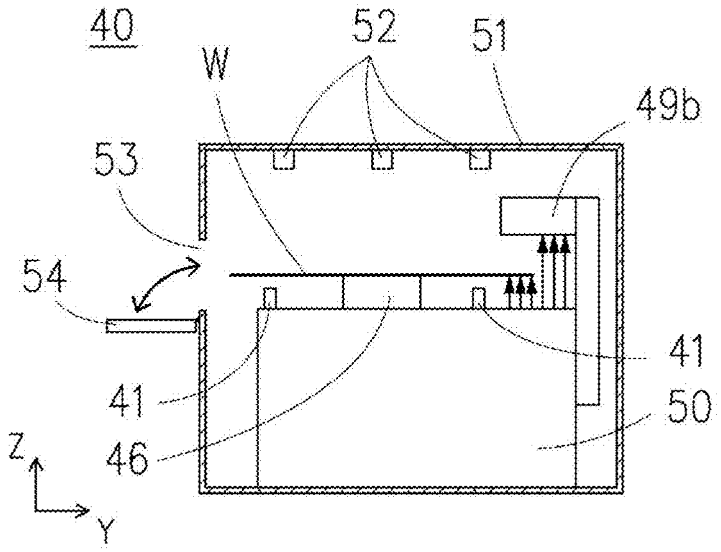
FIG. 10A and FIG. 10B are cross-sectional views showing an outline of an aligner 40 of an embodiment of the present invention.
Figure 10B:
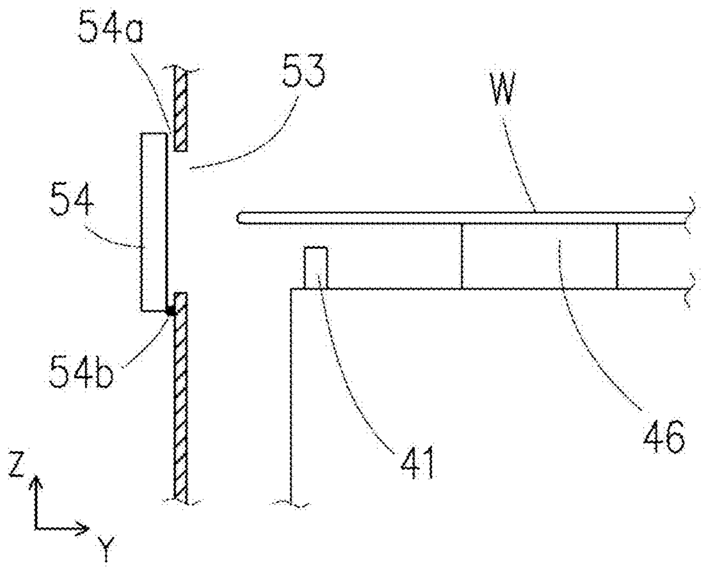

Next, an embodiment of an aligner 40 with an atmosphere replacing function provided in the transport apparatus 2 of the present invention will be described. FIG. 9 is a perspective view showing an aligner 40 with an atmosphere replacing function (hereinafter, referred to as "aligner 40") of the present embodiment, and FIGS. 10A and 10B are sectional views thereof. The aligner 40 of the present embodiment is for accurately positioning at a predetermined position set in advance by detecting a positional deviation amount of the center point of the wafer W and the position of a notch portion formed on the outer peripheral edge of the wafer such as a notch or an orientation flat in the inert gas atmosphere. The aligner 40 according to the present embodiment includes a top plate 42 on which temporary wafer placing bases 41 are erected upright, and an X-axis moving mechanism and a Y-axis moving mechanism 44 arranged below the top plate 42 so that they are orthogonal to each other. It is possible to move an elevating/lowering mechanism 45 arranged below the upper plate 42 within an X-Y plane through the X-axis moving mechanism 43 and the Y-axis moving mechanism 44. Further, an elevating/lowering table of the elevating/lowering mechanism 45 is provided with a spindle 46 and a spindle moving motor 48 for rotating the wafer W placed on the spindle 46 in the horizontal plane, an output shaft extending in the vertical direction of this motor 48 is connected to a rotary shaft provided below the spindle 46.

The spindle 46 is a wafer placing table on which the wafer W is placed horizontally, and has an adsorption hole 46*a* for adsorbing and holding the wafer W placed horizontally on the spindle 46. The adsorption hole 46*a* is connected to a vacuum source (not shown) through a piping member. A wafer holding solenoid valve (not shown) is arranged in the middle of the piping member that connects the vacuum source and the adsorption hole 46*a*, and the operation of the wafer holding solenoid valve is controlled by an aligner control unit 6. Besides, although the finger 18 of the present embodiment is in the form of holding the wafer W by vacuum adsorption force, other than that, it can be sufficiently held by a known holding means such as clamping. The aligner control unit 6 controls the inert gas according to a control program and various control data stored in advance. The control data includes data such as inert gas supply timing and inert gas supply time. Further, the aligner 40 may be provided with a sensor for measuring oxygen concentration and inert gas concentration, and the inert gas supply timing may be adjusted by detection value of this sensor. Further, a plurality of inert gas supply lines may be provided such as a large flow rate supply line and a small flow rate supply line, and the supply flow rate may be switched according to the detection value of the sensor.

The X-axis moving mechanism 43 is fixed to the bottom plate 47, and is composed of a slide guide 43*a* for guiding a moving element on which the Y-axis moving mechanism 44 is placed in the X-axis direction, a ball screw mechanism 43*b* that is placed parallel to the slide guide 43*a* and screwed with the moving element, and a motor 43*c* for driving the ball screw mechanism 43*b*. Further, the Y-axis moving mechanism 44 is composed of a slide guide 44*a* for guiding the moving element on which the elevating/lowering mechanism 45 is placed in the Y-axis direction, a ball nut 44*b* that is placed in parallel to the slide guide 44*a* and screwed with the moving element, and a motor 44*c* for rotating the ball nut about a rotation axis extending in the Y-axis direction as a rotation center. The elevating mechanism 45 includes a slide guide for guiding the moving element to which the spindle drive motor 48 is fixed in the vertical direction, that is, the Z-axis direction, a ball nut that is placed parallel to the sliding guide and screwed with the moving element, and a motor for rotating the ball nut about a rotation axis extending in the Z-axis direction as a rotation center. The X-axis driving mechanism 43, the Y-axis driving mechanism 44, the elevating/lowering mechanism 45, and the spindle drive motor 48 constitute a spindle drive means. A stepping motor capable of controlling an angle of the rotary shaft is used for each motor constituting the spindle drive means, and the operation of each motor is controlled by the aligner control unit 6.

A line sensor 49 is provided on the notched portion of the top plate 42 so as to sandwich the peripheral portions of the wafer W on the spindle 46 from above and below. The line sensor 49 includes a light projector 49*a* provided with a plurality of light emitting units arranged on a straight line and a light receiver 49*b* provided with a plurality of light receiving units arranged in a straight line, wherein the light projector 49*a* and the light receiver 49*b* are arranged so as to face each other below and above the wafer W and so that the optical axes of the detection light emitted from the light emitting units are perpendicular to the moving direction of the wafer W arranged on the spindle 46. The line sensor 49 detects eccentricity and eccentric direction of the wafer W center with respect to the rotation axis of the spindle 46 according to a detection value detected by the light receiver 49*b* when the detection light emitted from the projector 49*a* is blocked by the outer peripheral edge of the wafer W. The value measured by the light receiver 49*b* is transmitted to the aligner control unit 6 as an electric signal and is arithmetically processed by the aligner control unit 6. In general, the wafer W is often deviated from a predetermined design position before being transported from the FOUP 19 to the transport robot 30, and the wafer W placed on the spindle 46 by the transport robot 30 is placed eccentrically with respect to the rotation axis of the spindle 46, and therefore, the aligner 40 detects the eccentricity by rotating the wafer W on the spindle 46, moves the wafer W in the horizontal direction so that the actual center point position of the wafer W is located at an appropriate predetermined center position of the wafer W by the aligner control unit 6, at the same time, rotates the wafer W so that the actual notch position is located at an appropriate predetermined notch position.

A cover 50 is attached to the aligner 40 of the present embodiment so as to cover each mechanism arranged inside the aligner 40 in which the spindle driving means is arranged. The cover 50 prevents dust generated by the drive part of the spindle driving means from flowing out of the aligner 40. Further, the bottom plate 47 of the aligner 40 of the present embodiment is provided with an opening (not shown), and the inert gas and the general atmosphere described later flow out of a replacement container 51 through this opening. Therefore, the inside of the replacement container 51 can be replaced with an inert gas atmosphere in a short time. Further, the bottom plate 47 of the aligner 40 of the present embodiment may be provided with an exhaust fan that discharges air accumulated in the internal space of the aligner 40. The exhaust fan discharges air accumulated in the internal space of the aligner 40 to the outside through the opening formed in the aligner 40. With the above configuration, the wafer W placed on the spindle 46 will not be contaminated by dust generated by the spindle driving means.

Further, the aligner 40 of the present embodiment is arranged in the internal space of the replacement container 51 that can replace the internal space with the inert gas atmosphere. See FIGS. 10A and 10B. The replacement container 51 of the present embodiment includes a nozzle 52 for ejecting an inert gas to the ceiling, an opening 53 for the transport robot 30 to transport the wafer W to and from the aligner 40, and a lid 54 for closing the opening 53. An ejection port of the nozzle 52 is provided with a filter for removing impurities and dust adhering to the inside of tube members and the nozzle 52, and prevents the dust and the like from contaminating the wafer W. The lid 54 and the wall surface around the opening 53 of the replacement container 51 are not in contact with each other, and a minute gap 54*a* is provided. According to this, it is possible to prevent the generation of dust due to the contact between the lid 54 and the wall surface around the opening 53. Further, the atmosphere remaining inside the replacement container 51 is pushed out of the replacement container 51 through the gap 54*a* by the inert gas supplied from the nozzle 52, so that the inside of the replacement container 51 can be replaced with an inert gas atmosphere in a short time. Further, by supplying the inert gas into the replacement container 51 even after the replacement is completed, the inert gas flows out from the gap 54*a* to the outside of the container, and the inert gas flowing out to the outside serves as a sealing member to prevent dust and the like from entering the replacement container 51.

The lid 54 is driven by a known driving means such as a motor or an air cylinder. Opening/closing control of the lid 54 is performed by the aligner control unit 6. The lid 54 is opened when the transport robot 30 places the wafer W on the spindle 46 for alignment, or when the transport robot 30 transports an aligned wafer W to the next step. With the above configuration, the aligner 40 can perform alignment of the wafer W in the replacement container 51 maintained in the inert gas atmosphere, so that an unnecessary natural oxide film can be prevented from being formed on the surface to be processed of the wafer W during the alignment. Further, when the lid 54 is opened, the inert gas inside the replacement container 51 flows out, so that the concentration of the inert gas inside the replacement container 51 is decreased. Therefore, the aligner control unit 6 operates the solenoid valve provided in the aligner 40 to supply a larger flow rate of the inert gas than usual while the lid 54 is opened along with the action of opening the lid 54, thereby preventing the inert gas concentration inside the replacement container 51 from being decreased. The aligner control unit 6 may switch the flow rate of the inert gas at the opening/closing timing of the lid 54, but the flow rate may be switched by a sensor for detecting the oxygen concentration provided inside the replacement container 51. A large flow rate of the inert gas may be automatically supplied when a detection value of this sensor exceeds the specified value, and the flow rate may be automatically switched to the low flow rate when the detection value of the sensor falls below the specified value. Further, the aligner 40 of the present embodiment is provided with a lid 54 that can swing about a hinge 54*b*, but for example, it may also be provided with a lid that can be vertically slid with a gap 54*a* with respect to the replacement container 51.

Figure 11:
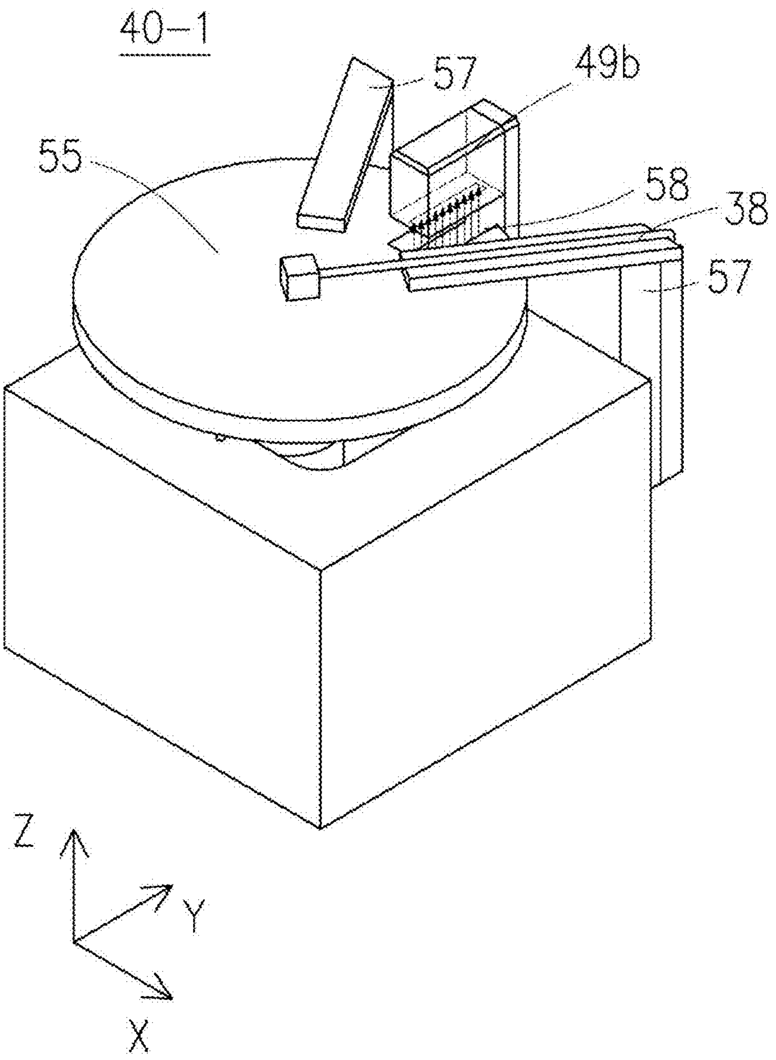
FIG. 11 is a perspective view showing an aligner 40-1 of an embodiment of the present invention.
Figure 12A:
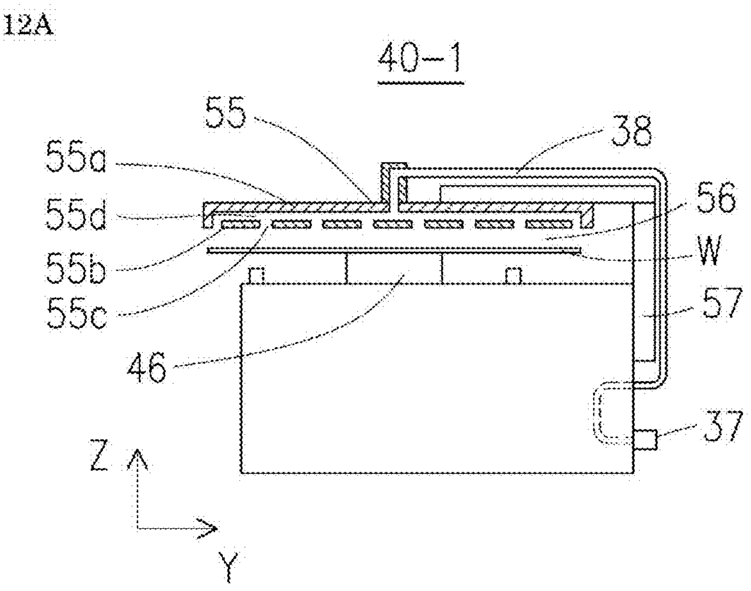
FIG. 12A and FIG. 12B are views showing an outline of an aligner 40-1, 40-2 of an embodiment of the present invention, respectively.

Next, another embodiment different from the aligner 40 will be described. FIG. 11 is a perspective view showing an aligner 40-1 with an atmosphere replacing function of the present embodiment, and FIG. 12A is a side view thereof. In the aligner 40-1 with an atmosphere replacing function of the present embodiment (hereinafter, referred to as "aligner 40-1"), an atmosphere on the surface to be processed of the wafer W is replaced by blowing an inert gas onto the surface to be processed of the wafer W which is aligned on the spindle 46 without providing with the replacement container 51 with a cover for covering the aligner 40. The aligner 40-1 of the present embodiment includes a shower plate 55 that ejects an inert gas toward the surface to be processed of the wafer W while holding the wafer W on the spindle 46, thereby preventing a natural oxide film from being formed on the surface to be processed.

The inert gas ejected from the shower plate 55 fills a space 56 formed by the shower plate 55 and the wafer W, and flows out to the outside together with the atmosphere remaining in the space 56. Then, by continuously supplying the inert gas, the atmosphere and dust remaining in the space 56 sequentially flow out to the outside of the space, and the space 56 is replaced with the inert gas atmosphere. Further, the inert gas ejected into the space 56 sequentially flows out through the gap between the shower plate 55 and the wafer W, and the outward flow of the inert gas flowing out to the outside serves as an air-seal, so that atmospheric air can be prevented from invading the surface to be processed which is the upper surface of the thin substrate W. Accordingly, the natural oxide film can be prevented from being formed on the surface to be processed of the thin substrate W. An ejection port of the shower plate 55 is provided with a filter for removing impurities and dust adhering to the inside of the tube members and the shower plate 55 to prevent the contamination of the wafer W caused by such dust and the like.

The shower plate 55 of the present embodiment is formed in a disk shape having a diameter equivalent to the diameter of the wafer W to be purged, and is supported by columns 57. The shower plate 55 of the present embodiment is composed of an upper member 55*a* in which a flow passage 55*d* for an inert gas is formed and a lower member 55*b* in which a plurality of through holes (spout holes) 55*c* for ejecting the inert gas are formed. The positions of the through holes (spout holes) 55*c* provided in the lower member 55*b* are arranged so as to communicate with a flow path 55*d* when the upper member 55*a* and the lower member 55*b* are bonded together. According to this, the inert gas supplied into the flow path 55*d* is ejected from the through hole 55*c* toward the surface to be processed of the semiconductor wafer W. A joint 37 is attached to the upper member 55*a* at a position communicating with the flow path 55*d*, and a tube member 38 for circulating an inert gas is connected to an inert gas supply source through a solenoid valve (not shown). Further, since the shower plate 55 has the same diameter as the diameter of the wafer W, the inert gas can be supplied to the entire surface to be processed of the wafer W while blocking the downflow of the clean air from the FFU 13, and in addition, the inert gas can be uniformly ejected onto the surface to be processed of the wafer W. The shower plate 55 is not limited to the above-described shape and size, and may be formed smaller or larger than the diameter of the wafer W. Further, the shape is not limited to the disk shape, and a polygon such as a square, a rectangle, or a hexagon can be sufficiently used. The shower plate 55 of the present embodiment is formed of anodized aluminum, but the present invention is not limited to this, and materials such as ceramics, carbon, and engineering plastics can be used.

Further, the shower plate 55 of the present embodiment is formed with a notch 58 extending in the radial direction from the central portion, and the notch 58 is configured so as to be passed by the optical axis of the line sensor 49 provided in the aligner 40-1. The notch 58 allows the shower plate 55 to replace the atmosphere on the surface to be processed of the wafer W without blocking the optical axis of the line sensor 49. Further, the shower plate 55 is placed at a position where it does not interfere with the holding part 18*a* and the purge part 18*b* of the finger 18 when the transport robot 30 accesses the aligner 40-1, and the transport robot 30 can pass the finger 18 through the space between the spindle 46 and the shower plate 55 and place the wafer W on the spindle 46 or remove the wafer W from the spindle 46. With the above configuration, the aligner 40-1 can eject the inert gas onto the surface to be processed of the wafer W while receiving the wafer W from the transport robot 30 and performing alignment of the wafer W. Accordingly, an unnecessary natural oxide film can be prevented from being formed on the surface to be processed.

Figure 12B:
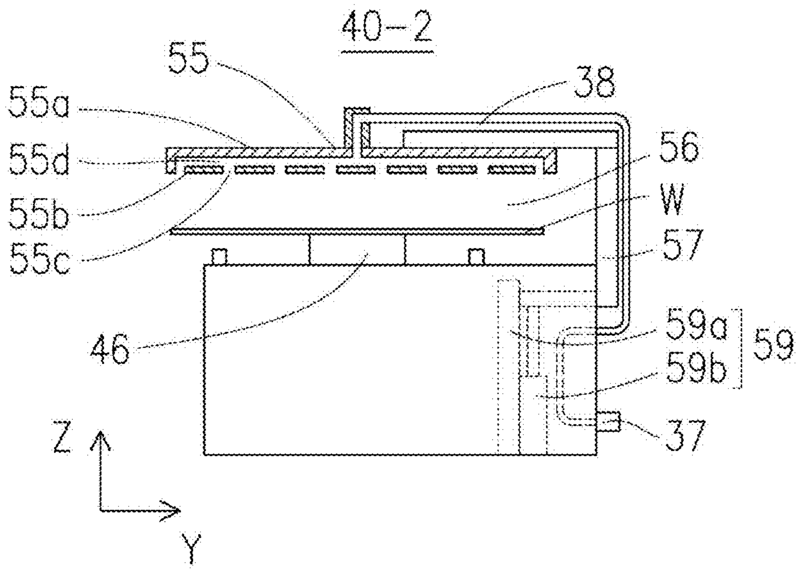

Further, as the third embodiment, an elevating/lowering mechanism 59 for moving the shower plate 55 up and down can be provided. FIG. 12B is a sectional view showing an aligner 40-2 according to the third embodiment. The elevating/lowering mechanism 59 provided in the aligner 40-2 with an atmosphere replacing function of the third embodiment (hereinafter referred to as "aligner 40-2") includes a linear guide 59*a* for guiding the shower plate 55 in the vertical direction, and an air cylinder 59*b* as a drive source for moving the shower plate 55 up and down. The linear guide 59*a* is fixed to the bottom plate 47 through a bracket so that the guide rail extends in the vertical direction, and the lower end portion of the column 57 supporting the shower plate 55 is fixed to the moving element moving on the rail. Further, in the air cylinder 59*b*, the cylinder body is fixed to the bottom plate 47 through a bracket so that the cylinder rod moves forward and backward in the vertical direction, and the tip end portion of the cylinder rod is fixed to the column 57. The air cylinder 59*b* is connected to an air supply source (not shown) through a pipe, and a regulator and a solenoid valve are connected in the middle of the pipe. The solenoid valve is electrically connected to the aligner control unit 6, and opens and closes the valve according to an operation signal of the aligner control unit 6. The opening and closing of this valve causes the piston rod of the air cylinder 59*b* to move forward and backward, whereby the shower plate 55 moves up and down in the vertical direction.

When accessing the transport robot 30 to the aligner 40-2, the aligner control unit 6 operates the solenoid valve provided in the aligner 40-2 to supply air into the air cylinder 59*b*, thereby moving the shower plate 55 up to a position separated from the spindle 46. Further, the aligner control unit 6 operates the solenoid valve of the aligner 40-2 to stop the supply of air into the air cylinder 59*b* when the transport robot 30 finishes loading the wafer W into the aligner 40-2, thereby moving the shower plate 55 down to a position closer to the wafer W. Further, when the aligner control unit 6 detects that the wafer W is placed on the spindle 46, the aligner control unit 6 operates the solenoid valve to eject the inert gas from the shower plate 55 toward the surface to be processed of the wafer W. Further, until just before the transport robot 30 accesses the wafer W on the spindle 46 after the alignment operation of the aligner 40-2 is completed, the aligner control unit 6 continues to supply the inert gas from the shower plate 55 and stops the supply of the inert gas when the fingers 18 of the transport robot 30 come into the aligner 40-2. As described above, by providing the aligners 40, 40-1, 40-2 with an atmosphere replacing function to the transport apparatus 2, it is possible to perform alignment without forming a natural oxide film on the surface to be processed of the wafer W, which has been transported while the surface to be processed is maintained in an inert gas atmosphere by the transport robot 30 with an atmosphere replacing function. Further, since the wafer W that has completed the alignment is transported to the processing apparatus 3 while the surface to be processed is maintained in the inert gas atmosphere by the transport robot 30 with an atmosphere replacing function, it is possible to transport the wafer W to the processing apparatus without forming any natural oxide film even though inside of the mini-environment space 4 is not maintained in the inert gas atmosphere.

Next, a buffer tool 60 with an atmosphere replacing function included in the transport apparatus 2 of the present invention will be described. The buffer tool 60 with an atmosphere replacing function of the present embodiment (hereinafter, referred to as "buffer tool 60") is located in the mini-environment space 4, which is a tool for temporarily storing the wafer W in order to reduce the waiting time caused by a difference in time required for processing the wafer W. The buffer tool 60 is not basically necessary for the processing apparatus 3 that takes a relatively short time to process and does not cause a waiting time for wafer transportation. When the processing time of the processing apparatus 3 is long, a long waiting time will occur, and the wafer W will be exposed to the general atmosphere, so that a natural oxide film will be formed on the surface to be processed. Therefore, the formation of the natural oxide film on the surface of the wafer W is suppressed by maintaining the space containing the wafer W in the buffer tool 60 in an inert gas atmosphere.

Figure 13:
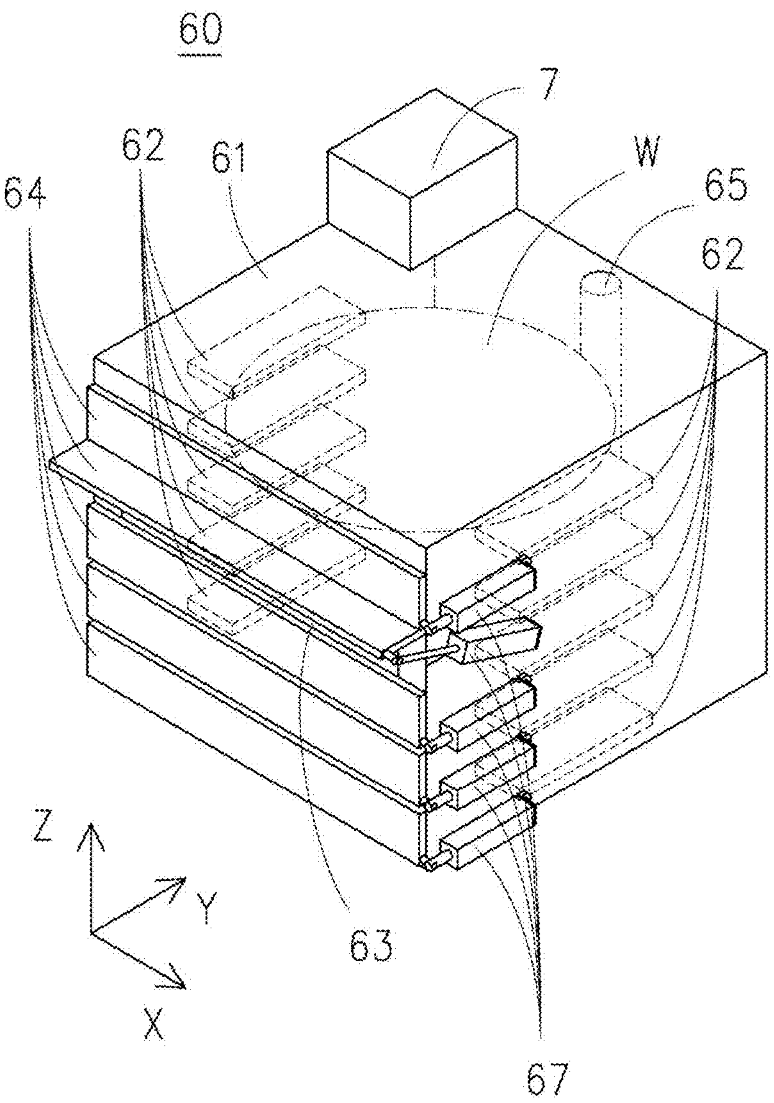
FIG. 13 is a view showing an outline of a buffer tool 60 of an embodiment of the present invention.
Figure 14A:
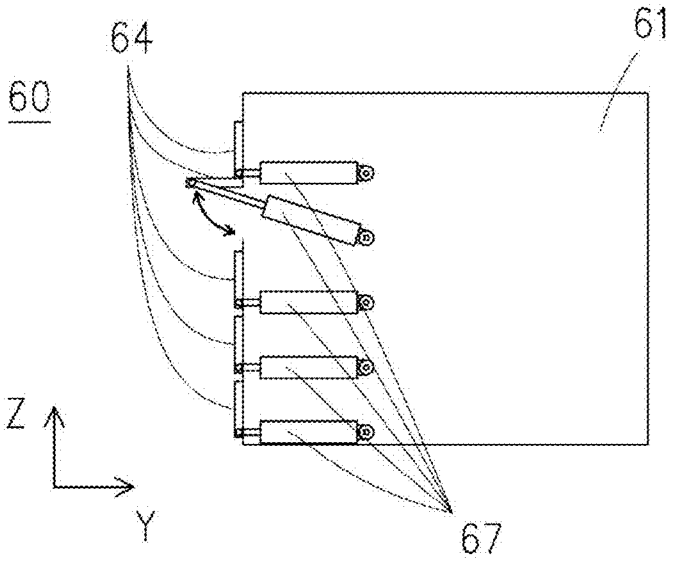
FIG. 14A and FIG. 14B are cross-sectional views showing an outline of a buffer tool 60 of an embodiment of the present invention.
Figure 14B:
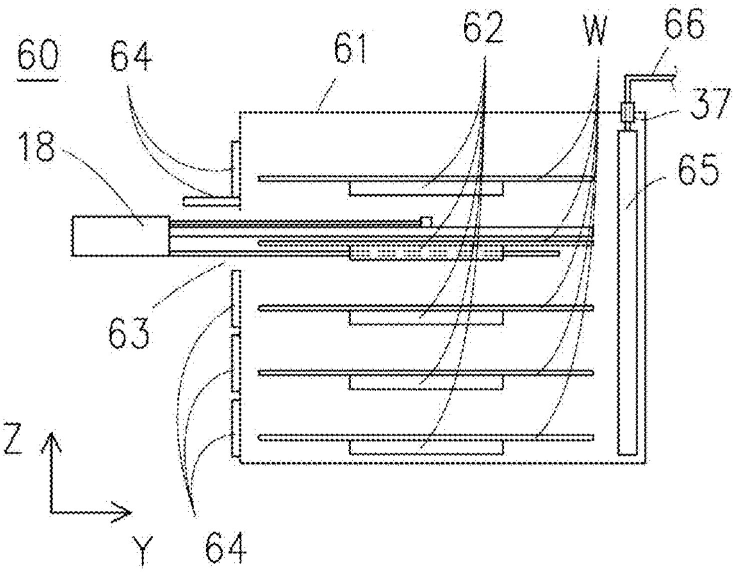

FIG. 13 is a view showing the buffer tool 60 of this embodiment, and FIGS. 14A and 14B are sectional views thereof. The buffer tool 60 of the present embodiment includes a box-shaped container 61 forming a space in which the wafer W is stored, a plurality of shelf plates 62 on which the wafers W are placed with a space between them in the vertical direction, a plurality of openings 63 provided in the container to load/unload the wafer W on each shelf plate 62, a plurality of shutters 64 for closing each of these opening 63, and nozzles 65 for supplying an inert gas into the container 61.

The box-shaped container 61 forming the buffer tool 60 of the present embodiment is made of stainless steel and is formed into a rectangular parallelepiped. An opening 63 is formed on the face of the buffer tool 60 facing the transport robot 30, and the transport robot 30 transports the held wafer W into the container 61 through the opening 63, or unloads the wafer W stored inside the buffer tool 60. Further, the buffer tool 60 is provided with shutters 64 that close the openings 63 to prevent the inert gas filled inside the container 61 from flowing out to the outside of the container 61. The upper portion of each shutter 64 is provided with a hinge, which is configured to rotate about a rotation axis extending in the horizontal direction of the hinge as a rotation center. Further, the tips of piston rods of air cylinders 67, each of which is a drive source for opening and closing each shutter 64, is connected to each shutter 64, and a cylinder body of each air cylinder 67 is rotatably attached to the container 61. The air cylinders 67 are connected to an air supply source (not shown) through a pipe 66, and a regulator and a solenoid valve are connected in the middle of the pipe. The solenoid valve is electrically connected to the buffer control unit 7 to open and close the valve according to an operation signal of the buffer control unit 7. By opening and closing the valve, the piston rod of the air cylinder 67 moves forward and backward, whereby the shutter 64 rotates with respect to the wall surface of the container 61 to open and close the opening 63.

Inside the box-shaped container 61, a plurality of shelf plates 62 on which a wafer W is placed are arranged in a vertical shelf shape with predetermined intervals, i.e., shelf shaped as used herein refers to an arrangement wherein the shelf plates are vertically aligned, oriented or arranged and each shelf plate is vertically spaced a predetermined distance from one or more adjacent shelf plates. The shelf plates 62 are arranged at opposite positions in the container 61, and the wafer is supported in a horizontal posture by a pair of opposite shelf plates 62. Each shutter 64 is arranged so that the fingers 18 of the transport robot 30 accessing each shelf plate can pass through. When attempting to access the wafer W stored on the desired shelf plate 62, only the corresponding shutter 64 needs to be opened. With the above configuration, the area of the opening 63 for accessing the wafer W can be minimized, and thus the outflow of the inert gas filled in the container 61 to the outside can be minimized.

A nozzle 65 for supplying an inert gas into the container 61 of the buffer tool 60 is provided behind the container 61 on the side opposite to the opening 63. The nozzle 65 of the present embodiment is a cylindrical member having a large number of ejection ports formed therein, and a joint 37 is attached to the upper portion thereof, and a tube member for circulating an inert gas is connected to an inert gas supply source (not shown) through a solenoid valve. The solenoid valve is electrically connected to the buffer control unit 7 to open and close the valve in response to an operation signal from the buffer control unit 7, thereby switching the supply and stop of the inert gas. Further, a filter for removing impurities and dust adhering to the inside of the tube member, the joint 37 and the like are provided inside the nozzle 65 to prevent the dust and the like from contaminating the wafer W. The buffer control unit 7 controls the inert gas according to a control program stored in advance and various control data. The control data includes data such as a supply timing of the inert gas and a supply time. Further, it is also possible to provide a sensor for measuring the oxygen concentration or the concentration of the inert gas in the container 61 of the buffer tool 60 and adjust the supply timing of the inert gas according to the detection value of this sensor. Further, a plurality of inert gas supply lines may be provided, such as a large flow rate supply line and a small flow rate supply line, and the supply flow rate may be switched according to the detection value of the sensor.

Further, by providing an ejection port on the bottom of the container 61, the general atmosphere remaining in the container 61 flows out to the outside of the buffer tool 60 through the ejection port, so that the atmosphere replacement in the container 61 is efficiently performed. The nozzle 65 for supplying the inert gas is not limited to being provided behind the container 61 on the side opposite to the opening 63, and may be provided on the side surface on which the shelf plate 62 supporting the wafer W is arranged. As another embodiment of the nozzle 65 included in the buffer tool 60, the nozzle 65 is provided on each of both side surfaces of the shelf plate 62 which is arranged at an opposite position. With the above configuration, it becomes possible to uniformly supply the inert gas to the surface to be processed of each wafer W, as compared with the first embodiment in which only one nozzle 65 is provided.

Figure 15:
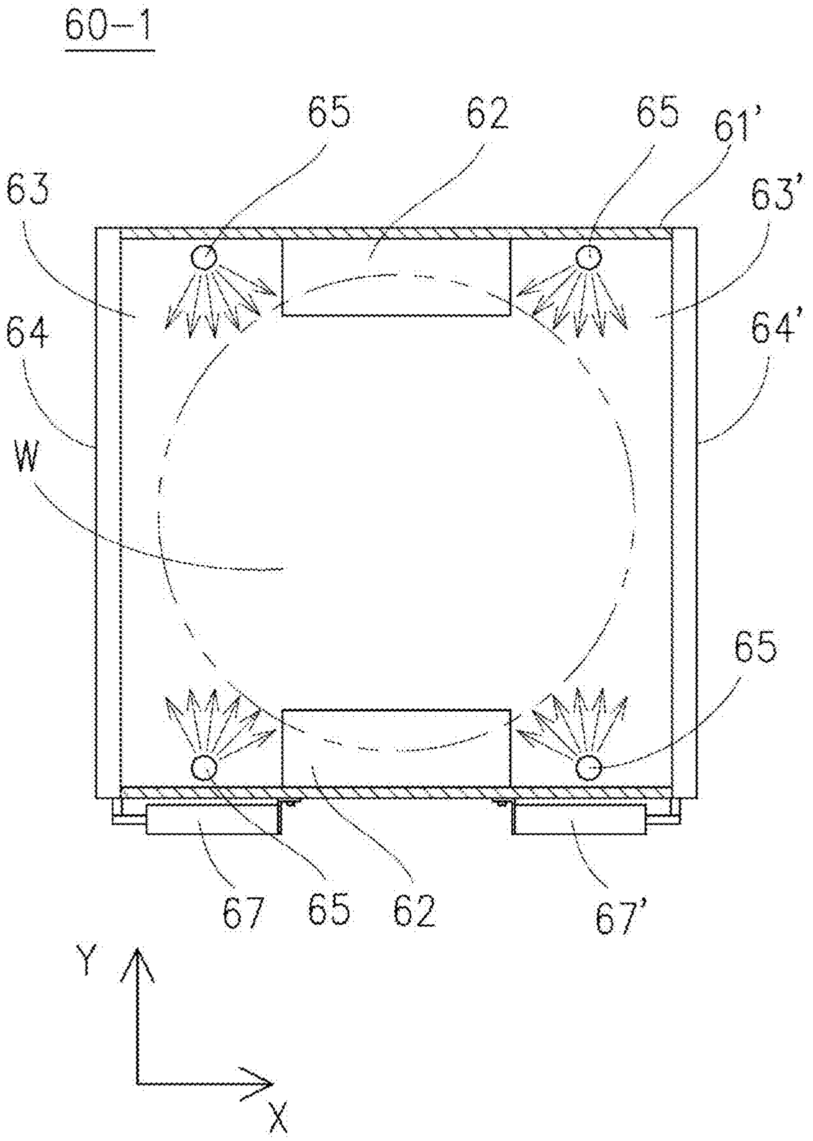
FIG. 15 is a view showing an outline of a buffer tool 60-1 of an embodiment of the present invention.

Next, a second embodiment of the buffer tool 60 will be described. FIG. 15 is a view showing a buffer tool 60-1 with an atmosphere replacing function of this embodiment. The buffer tool 60-1 with an atmosphere replacing function of the present embodiment (hereinafter referred to as "buffer tool 60-1") is so configured that an opening 63' is provided also on the opposite surface of the opening 63 to access the wafer W, a plurality of shutters 64' for closing the opening 63' are provided similar to the opening 63, a hinge is provided on the upper part of each shutter 64', and a rotation axis extending in the horizontal direction of the hinge rotates as a rotation center. The shutter 64' is opened and closed by an air cylinder 67'. With the above-described configuration, the transport robot 30 can access the wafer W placed on the shelf plate 62 inside the container 61' from any of the openings 63 and 63' arranged to face each other.

Figure 16:
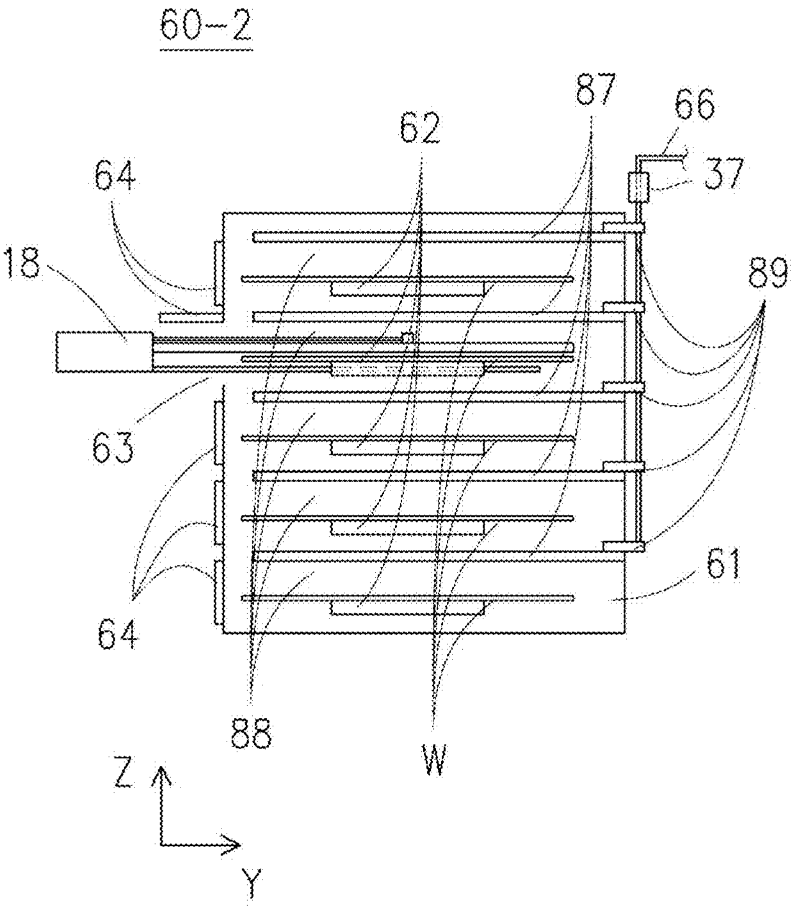
FIG. 16 is a cross-sectional view showing an outline of a buffer tool 60-2 of an embodiment of the present invention.

Further, the buffer tool 60-2 of the present embodiment can also be provided with a plate-like shower plate 87 inside, as is provided by the transport robot 30 and the aligner 40-1. FIG. 16 is a sectional view showing a buffer tool 60-2 which is another embodiment of the present invention. In the buffer tool 60-2 of this embodiment, a shower plate 87 is arranged above each shelf plate 62 supporting the wafer W. The shower plate 87 ejects an inert gas toward the surface to be processed of the wafer W placed on each shelf 62, thereby preventing a natural oxide film from being generated on the surface to be processed of the wafer W. The inert gas ejected from the shower plate 87 fills a space 88 formed by the shower plate 87 and the wafer W, and then flows out of the buffer tool 60-2 together with the atmosphere remaining in the space 88. The ejection port of the shower plate 87 may be provided with a filter for removing impurities and dust adhering to the inside of the tube member and the shower plate 87, thereby preventing dust or the like from contaminating the wafer W.

The shower plate 87 of this embodiment is formed in a disk shape having a diameter equivalent to the diameter of the wafer W to be purged, and is supported by the wall surface of the container 61. The shower plate 87 is composed of two members, an upper member in which a flow path of an inert gas is formed and a lower member in which a plurality of through holes (ejection ports) for ejecting the inert gas are formed. The position of the through hole (ejection port) provided in the lower member is located at a position communicating with the flow path formed in the upper member, and the inert gas supplied in the flow path is discharged from the through hole toward the surface to be processed of the semiconductor wafer W. Further, a joint 89 communicating with each flow path is attached to each shower plate 87, and a pipe 66 for circulating an inert gas is connected to the inert gas supply source through a solenoid valve (not shown). The shower plate 87 of the present embodiment is not limited to the disc shape, and may be a polygon such as a square, a rectangle, or a hexagon. The shower plate 87 of this embodiment is made of a material such as anodized aluminum, ceramic, carbon, or engineering plastic.

Figure 17A:
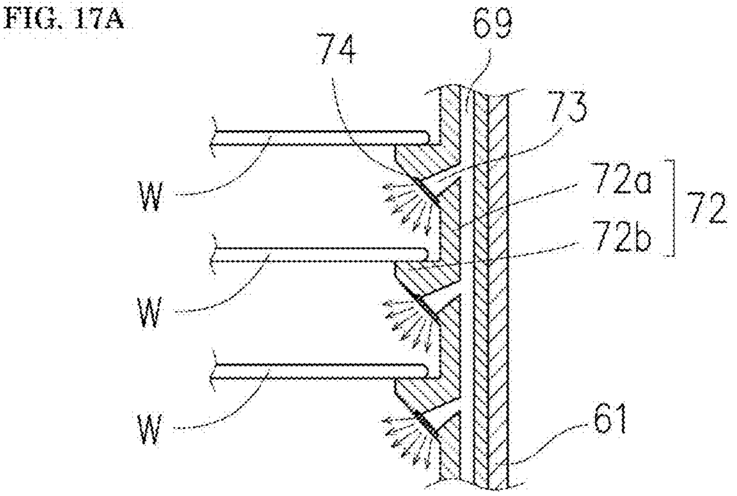
FIG. 17A and FIG. 17B are views showing an outline of a buffer tool 60-3 of an embodiment of the present invention.
Figure 17B:
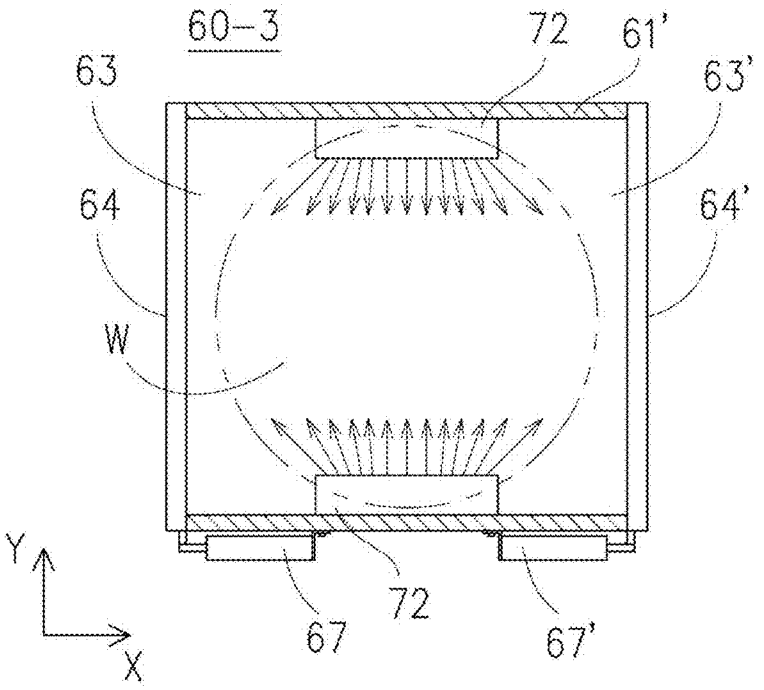

Further, instead of the shelf plate 62, a shelf member 72 in which a flow path 69 is formed is arranged in the internal space of the buffer tool 60, and may be formed so as to eject an inert gas from an ejection port 73 formed in the shelf member 72 toward the surface to be processed of the wafer W. FIGS. 17A and 17B are cross-sectional views showing cross-sections of the shelf member 72 provided with the flow path 69 for the inert gas and a buffer tool 60-3 provided with the shelf member 72. The shelf member 72 of the present embodiment includes a column portion 72*a* that extends in the vertical direction and a shelf portion 72*b* that is formed by protruding horizontally from the column portion 72*a*. The wafer W transported into the buffer tool 60-3 is placed on the upper surface of the shelf portion 72*b*. A joint 37 is attached to one end of the flow path 69 formed in the shelf member 72, and a tube member for circulating an inert gas is connected to the inert gas supply source through a solenoid valve (not shown). Further, a plate-shaped filter 74 is fixed to the ejection port 73 at the tip of the flow path 69, and the inert gas supplied to the flow path 69 passes through the minute gaps in glass fibers forming the filter 74 to be supplied in the container 61. By supplying the inert gas through the filter 74, a relatively large amount of gas can be supplied to the inside of the container 61 without winding up dust accumulated in the corner of the container 61. Further, the wafer W is prevented from being contaminated by impurities and dust adhering to the inside of the tube member and the shelf member 72. With the configuration in which the inert gas is ejected from the shelf member 72 as in the above configuration, it is not necessary to provide the nozzle 65 inside the container 61, so that the container 61 can be formed compactly. The buffer tools 60-1, 60-3 having the openings 63, 63' on both sides are suitable for the transport apparatus 2' in which the two transport robots 30-1*a* and 30-1*b* are provided at positions facing each other.

Figure 18:
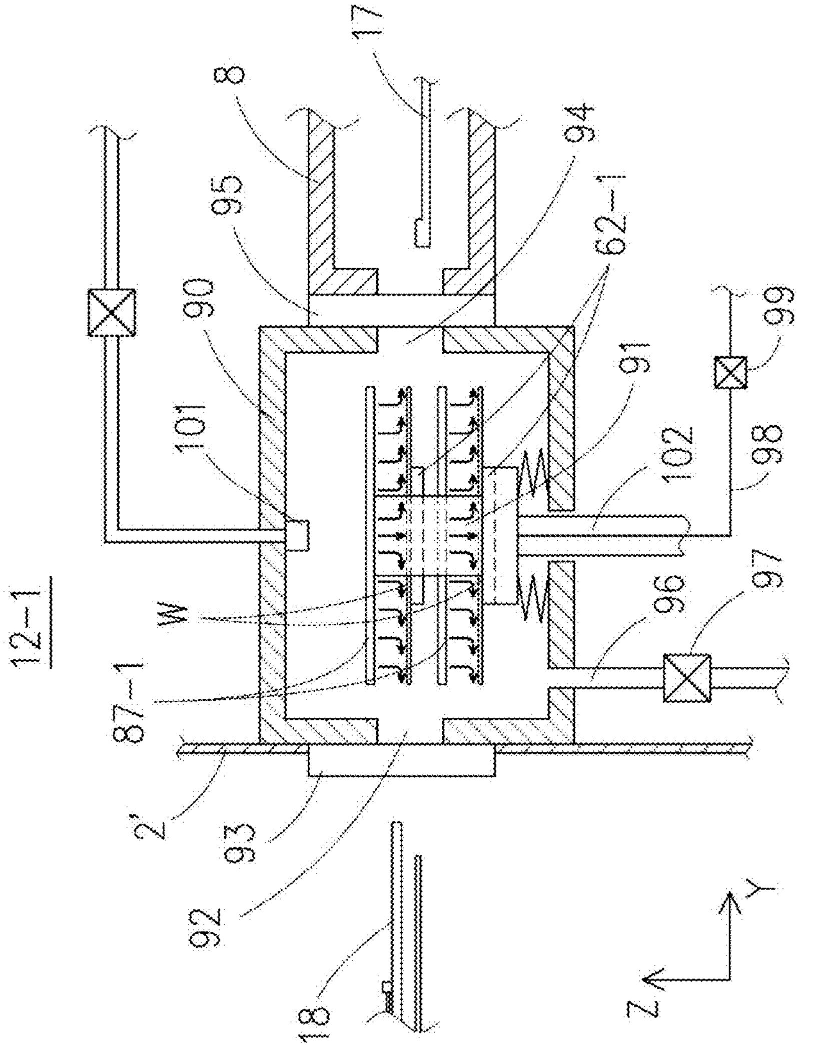
FIG. 18 is a cross-sectional view showing a load lock chamber 12-1 having an atmosphere replacing function of an embodiment of the present invention.

Further, the buffer tool 60-3 described above is configured to include the shower plate 87 for ejecting the inert gas toward each of the surfaces to be processed of the wafer W placed on the shelf plate 62. The configuration can be applied to the load lock chamber 12 and other wafer delivery tools other than the buffer tool 60-3. FIG. 18 is a sectional view showing a load lock chamber 12-1 with an atmosphere replacing function according to an embodiment of the present invention. The load lock chamber 12-1 with an atmosphere replacing function (hereinafter, referred to as "load lock chamber 12-1") of the present embodiment includes a vacuum container 90, a shelf plate 62-1 on which a wafer W is placed, a shower plate 87-1 for ejecting an inert gas toward the surface to be processed of the wafer W placed on the plate 62-1, a support member for vertically supporting the shelf plate 62-1 and the shower plate 87-1, and an elevating/lowering mechanism 102 for moving the support member 91 up and down. The load lock chamber 12-1 of the present embodiment is a tool for relaying the wafer W between the transport apparatus 2 and the transport chamber 8, and the surface of the vacuum container 90 facing the transport apparatus 2 is provided with an opening 92 through which the wafer W can pass. The opening 92 has a structure that can be airtightly closed by a gate valve 93. In addition, an opening 94 through which the wafer W can pass is provided on the surface of the vacuum container 90 facing the transport chamber 8, and this opening 94 has a structure that can be airtightly closed by a gate valve 95. The gate valves 93, 95 are lid members capable of airtightly closing the corresponding openings 92, 94, respectively. The gate valve 93 can close and open the openings 92 provided between the load lock chamber 12-1 and the mini-environment space 4. Further, the gate valve 95 can close and open the opening 94 provided between the transfer chamber 8 and the load lock chamber 12-1.

The internal space of the vacuum container 90 communicates with a vacuum pump (not shown) through an exhaust pipe 96. Further, a valve 97 is provided in the middle of the exhaust pipe 96, and the opening degree can be adjusted by the degree of vacuum inside the vacuum container 90. Further, the shower plate 87-1 is connected to an inert gas supply source (not shown) through a pipe 98. A valve 99 is provided in the middle of the pipe 98. The valves 97, 99 are electrically connected to a load lock control unit 100, and the signals transmitted from the load lock control unit 100 cause the valves 97, 99 to open and close.

When the wafer W is transported from the transport apparatus 2 by the transport robot 30, the load lock control unit 100 operates the valve 99 to maintain the inside of the vacuum container 90 in an inert gas atmosphere. Further, when the wafer W is placed on the shelf plate 62-1 by the transport robot 30, the inert gas is ejected from the shower plate 87-1 to prevent an oxide film from being generated on the surface to be processed of the wafer W. In order to transport the wafer W to the load lock chamber 12-1, by using the transport robot 30 with an atmosphere replacing function according to the embodiment of the present invention, an oxide film is not formed on the wafer W during the transportation. However, when the wafer W is loaded, the inside of the vacuum container 90 is maintained in an inert gas atmosphere, but the gate valve 93 is opened, and the air inside the transport apparatus 2 flows into the internal space of the vacuum container 90. Therefore, the oxygen concentration in the internal space is slightly increased. Therefore, by ejecting an inert gas from the shower plate 87-1 onto the surface to be processed of the loaded wafer W, the generation of an unnecessary oxide film can be prevented. When the transportation of the wafer W is completed, the gate valve 93 is closed and the internal space of the vacuum container 90 is evacuated. Needless to say, the supply of the inert gas is stopped during the evacuation.

Further, the load lock chamber 12-1 of the present embodiment also works effectively when the internal space of the vacuum container 90 is raised from the vacuum state to the atmospheric pressure and the wafer W is unloaded to the transport apparatus 2 side. When the wafer W is loaded from the transport chamber 8, the internal space of the vacuum container 90 is maintained in a vacuum atmosphere. When the loading of the wafer W is completed, the gate valve 95 is closed, and the internal space of the vacuum container 90 is raised to the same level as the atmospheric pressure by the inert gas supplied from the shower plate 87-1 to the internal space of the vacuum container 90. At this time, the shower plate 87-1 ejects the inert gas from the closest distance to the wafer W placed on the shelf plate 62-1 so that the reaction gas remaining on the surface to be processed of the wafer W is removed. Further, since the surface to be processed is replaced by the inert gas, no natural oxide film is formed. Further, the wafer W having residual heat immediately after the heat treatment is cooled more quickly by the inert gas ejected from the closest distance.

It is important that the shower plate 87-1 is disposed near the wafer W and ejects the inert gas onto the surface to be processed of the wafer W. The shape can be formed in various shapes such as a disc shape, a rectangle, and an ellipse. Further, other than the plate shape, a cylindrical shape or a semicircular shape may be used. In addition to the shower plate 87-1, a nozzle 101 for supplying an inert gas may be provided inside the load lock chamber 12-1 so that the pressure inside the load lock chamber 12-1 can be quickly increased.

Figure 19:
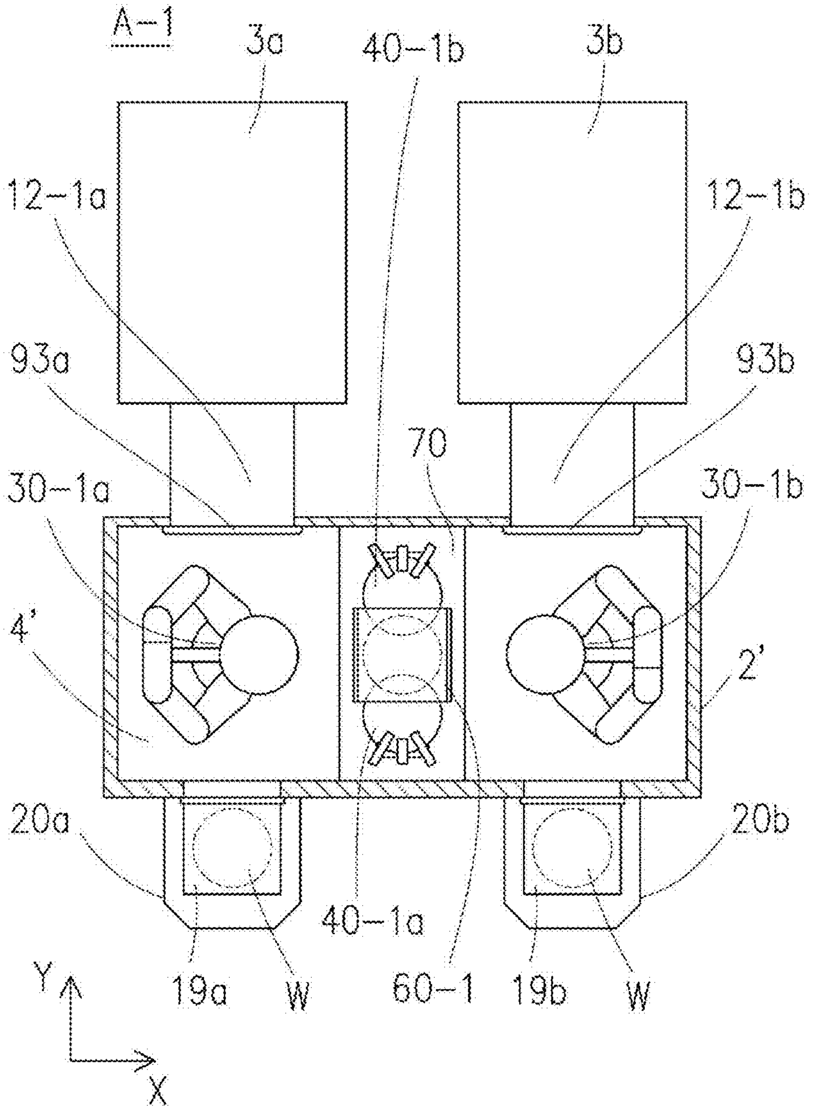
FIG. 19 is a cross-sectional view showing a processing system A-1 of an embodiment of the present invention.
Figure 20:
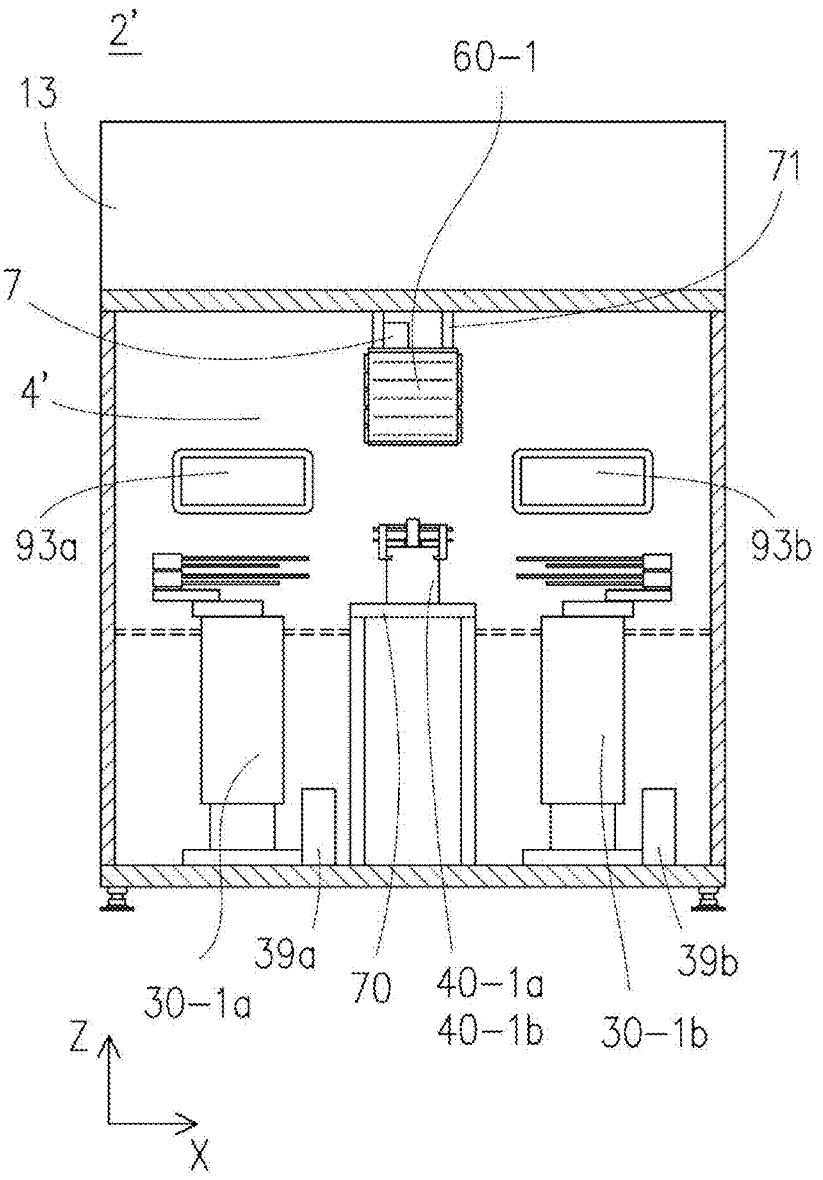
FIG. 20 is a cross-sectional view showing a transport apparatus 2' of an embodiment of the present invention.

FIG. 19 is a cross-sectional view of a processing system A-1 including a transport apparatus 2' providing with two transport robots 30-1*a*, 30-1*b* as viewed from above, and FIG. 20 is a cross-sectional view of the transport apparatus 2' as viewed from the front. The transport apparatus 2' of the present embodiment is equipped with two load ports 20*a*, 20*b* with an atmosphere replacing function on the front surface, and two processing apparatuses 3*a*, 3*b* are arranged at the positions facing the respective load ports 20*a*, 20*b* on the rear face of the transport apparatus 2'. Further, a load lock chamber 12-1*a* with an atmosphere replacing function is located between the transport apparatus 2' and the processing apparatus 3*a*, and a load lock chamber 12-1*b* with an atmosphere replacing function is located between the transport apparatus 2' and the processing apparatus 3*b*. The FFU 13 is located on the ceiling of the transport apparatus 2 to always maintain the mini-environment space 4' in a clean atmosphere. Further, two transport robots 30-1*a*, 30-1*b* with an atmosphere replacing function are located in the mini-environment space 4'. The transport robots 30-1*a*, 30-1*b* are located at the preventive intermediate positions between the load port 20*a* and the processing apparatus 3*a*, which are arranged to face each other, and between the load port 20*b* and the processing apparatus 3*b*, which are arranged to face each other. Then, the load port 20*a*, the processing apparatus 3*a*, and the transport robot 30-1*a*, and the load port 20*b*, the processing apparatus 3*b*, and the transport robot 30-1*b* are located on a straight line parallel to the Y axis.

The two transport robots 30-1*a*, 30-1*b* are located at a predetermined interval, and a table 70 is provided between the two transport robots 30-1*a*, 30-1*b*. Further, on this table 70, two aligners 40-1*a*, 40-1*b* with an atmosphere replacing function are fixed. Further, the buffer tool 60-1 with an atmosphere replacing function of the present embodiment is provided above the aligners 40-1*a*, 40-1*b*, and are held from above by a pillar 71 fixed to the ceiling frame 4*a* of the transport apparatus 2'. The two aligners 40*a*, 40*b* with an atmosphere replacing function provided in the transport apparatus 2' of the present embodiment are provided with the shower plate 55 above the spindle 46 holding the wafer W, and are located at positions where the transport robots with an atmosphere replacing function 30-1*a*, 30-1*b* located on the left and right sides can access.

According to the transport apparatus 2' having the above-described configuration, the one transport robot 30-1*a* takes out the wafer W from the FOUP 19*a* placed on the one load port 20*a*, transports the wafer W to the aligner 40*a*, thereafter accurately positions the wafer W by the aligner 40*a*, and then transports the wafer W to the processing apparatus 3*a*. When the processing by the processing apparatus 3*a* is completed, the transport robot 30-1*a* takes out the wafer W from the processing apparatus 3*a* and transports the wafer W to the buffer tool 60-1. The wafer W transported to the buffer tool 60-1 is taken out by the other transport robot 30-1*b*, is accurately positioned by the aligner 40*b*, and is then transported to the processing apparatus 3*b*. When the processing by the processing apparatus 3*b* is completed, the wafer W is transported to the FOUP 19*b* placed on the load port 20*b* by the transport robot 3*b*.

Figure 21:
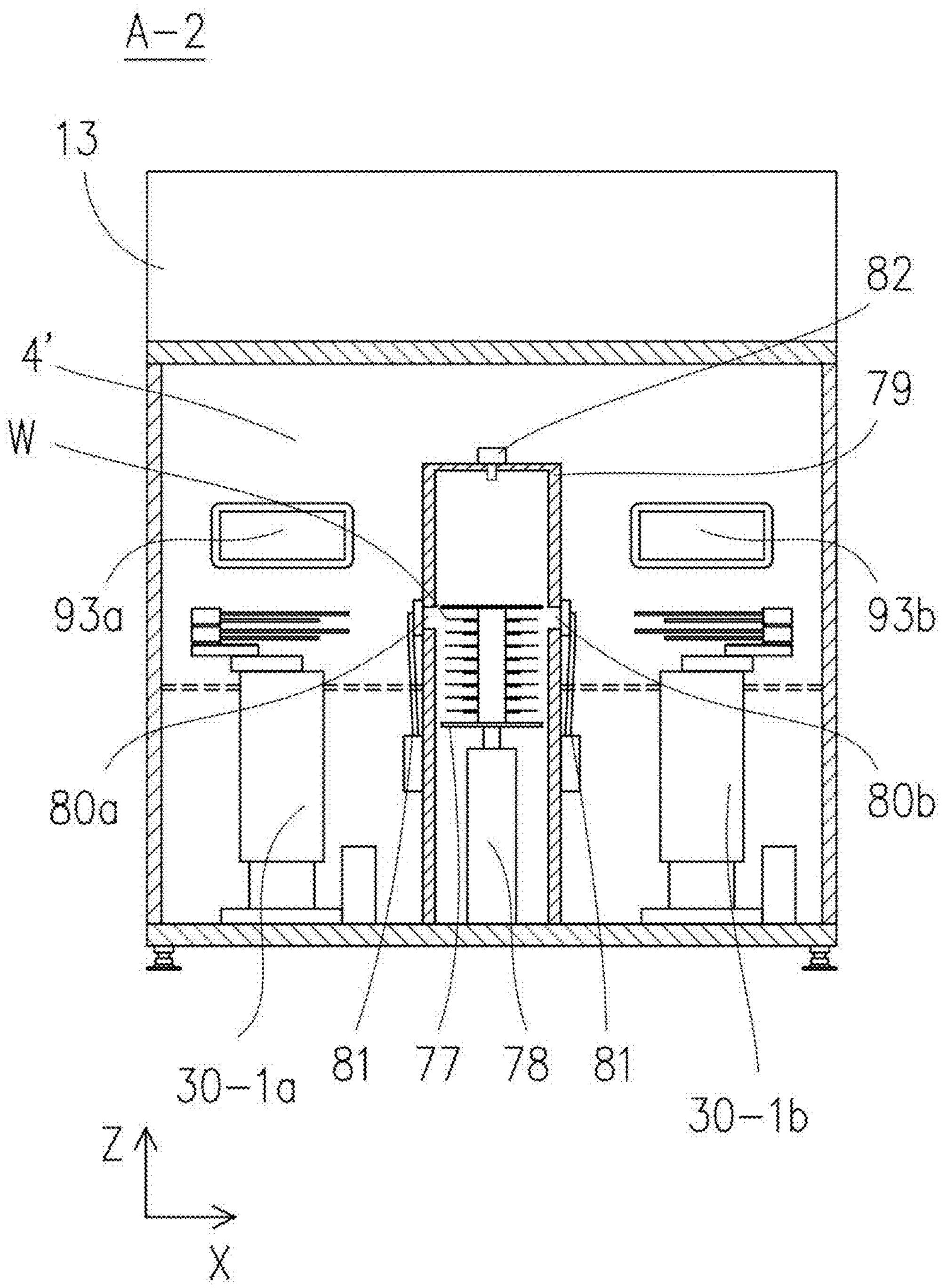
FIG. 21 is a cross-sectional view showing a processing system A-2 of an embodiment of the present invention.

Although the wafers are suspended in the mini-environment space 4' in the buffer tool 60-1, other embodiments are also possible. FIG. 21 is a cross-sectional view showing a processing system A-2 equipped with a buffer tool 60-3 according to another embodiment. The buffer tool 60-3 of the present embodiment includes a cassette 77 on which a large number of wafers W are placed at predetermined intervals in the vertical direction, a cassette elevating/lowering mechanism 78 for moving the cassette 77 up and down, and a cover 79 for covering the cassette 77 and the cassette elevating/lowering mechanism 78. Further, openings 80*a*, 80*b* through which the finger 18 can pass are formed on the respective surfaces of the cover 79 facing the transport robots 30-1*a*, 30-1*b*, and configured to be closed by their respective shutter mechanisms 81.

The openings 80*a*, 80*b* are set to heights such that the transport robots 30-1*a*, 30-1*b* can access, respectively. The wafer W on the predetermined shelf of the cassette 77 is moved up and down for the respective openings 80*a*, 80*b* by the operation of the cassette elevating/lowering mechanism 78, so that each of the transport robots 30-1*a*, 30-1*b* can access the predetermined wafer W. Further, a nozzle 82 for supplying an inert gas to the inside of the buffer tool 60-3 is provided on a ceiling portion of the cover 79. Further, a slit (not shown) is provided at the bottom of the buffer tool 60-3, and the general atmosphere inside the buffer tool 60-3 is pushed out by the inert gas, so that the atmosphere inside the buffer tool 60-3 can be efficiently replaced.

As described above, by fixing the buffer tool 60-3 on the floor surface of the transport apparatus 2 and making the cassette 77 movable up and down, the cassette can store the large number of wafers W.

As described above, by including the load port 20 with an atmosphere replacing function, the transport robot 30 with an atmosphere replacing function, the aligner 40 with an atmosphere replacing function, and the buffer tool 60 with an atmosphere replacing function, the path on which the wafers W are placed and moved is locally maintained in the atmosphere replaced with the inert gas, so that there is no need to maintain the entire mini-environment space 4' in the inert gas atmosphere. Further, it is desirable that the inert gas supply line provided in each embodiment of the present invention is provided with a filter for removing impurities and dust mixed in the inert gas or adhering to the inside of the pipe. Since the inert gas supply line is provided with a filter, the surface to be processed of the wafer W is always maintained in a highly clean atmosphere by the respective units such as the load port 20 and the transport robot 30, so that there is no need to maintain the insides of the mini-environment spaces 4, 4' in a highly clean atmosphere. That is, since the transport apparatuses 2, 2' no longer need to be provided with the expensive FFU 13, costs can be significantly reduced.

Figure 22:
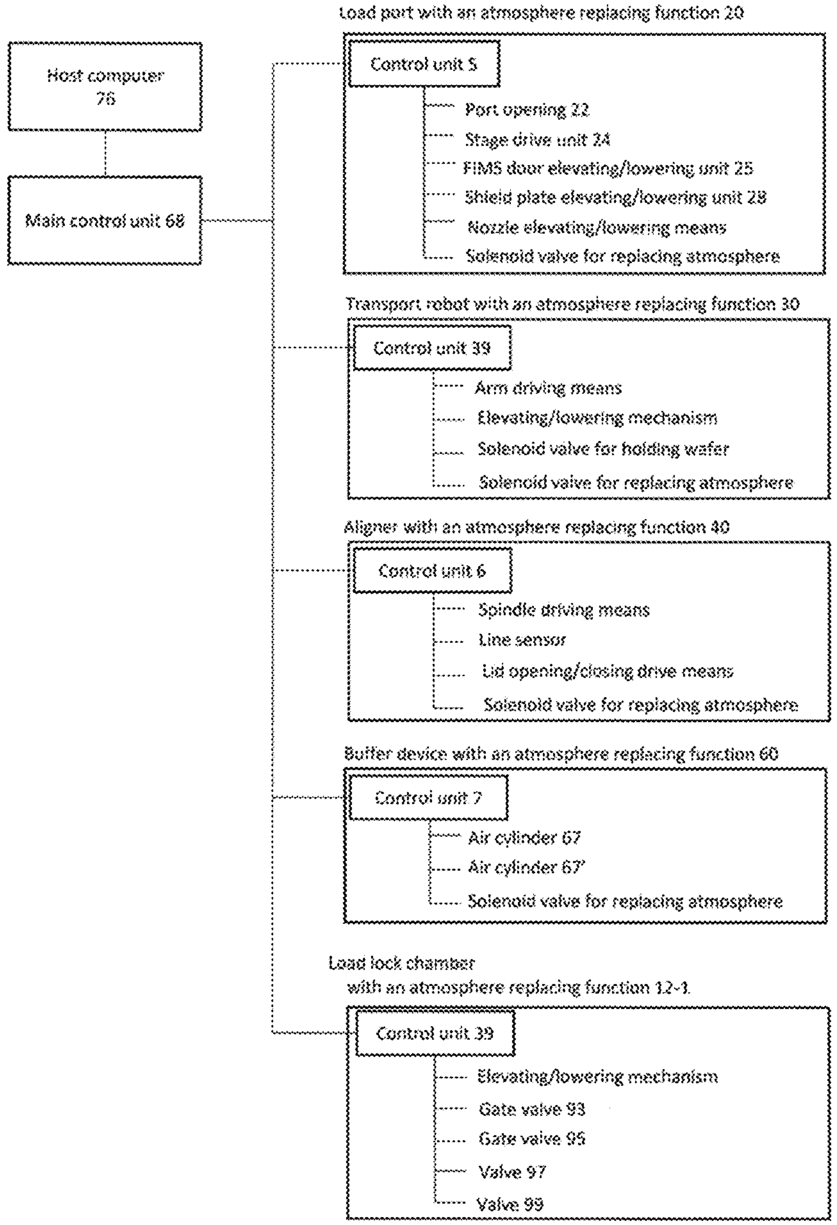
FIG. 22 is a view showing a control system of transport apparatuses 2, 2' of the present invention.

The apparatus with an atmosphere replacing function included in the transport apparatuses 2, 2' of the present invention respectively include control units 5, 6, 7, 39, and are configured individually so as to control the ejection and stopping of the inert gas and control the operation of each driving mechanism. The transport apparatuses 2, 2' include a main control unit 68 for controlling the entire transport operation in order to transport the wafer W to a target position. FIG. 22 is a block view showing the control system of the transport apparatuses 2, 2' of the present invention. The main control unit 68 includes at least a host computer 76 provided in a semiconductor manufacturing factory, a communication module communicating with each control unit 5, 6, 7, 39 provided in the apparatus with an atmosphere replacing function, a central processing unit, a storage apparatus for storing the control program and various data which are created in advance, and a logic circuit. The main control unit 68 transmits an operation command to each apparatus with an atmosphere replacing function based on the control command received from the host computer 76. Each apparatus with an atmosphere replacing function operates a motor, a solenoid valve, etc. according to the control program stored in advance in each control unit 5, 6, 7, 39 to perform a predetermined operation. Further, when the predetermined operation is completed, a feedback signal is transmitted to the main control unit 68. The main control unit 68, which has received the feedback signal transmitted from each apparatus with an atmosphere replacing function, transmits the next operation command according to the control program stored in advance. Through such a series of operations, the wafer W is transported to a predetermined position while the surface to be processed is maintained in an inert gas atmosphere.

Although the embodiments of the present invention have been described in detail with reference to the drawings, the present invention is not limited to the above embodiments, and modifications and the like can be made within the scope of the subject matter of the present invention. For example, each buffer sensor 60, 60-1, 60-2 with an atmosphere replacing function of the present embodiment may be provided with a detection sensor for the wafer W to supply the inert gas only while the wafer W is placed on the shelf plate 62. Further, since the space in which the wafer W moves is maintained in a clean inert gas atmosphere, the transport apparatuses 2, 2' may not be provided with the FFU 13.

DESCRIPTION OF SYMBOLS

1 EFEM
2, 2' transport apparatus
3, 3*a*, 3*b* processing apparatus
4, 4' mini-environment space
4-*a* frame
4-*b* cover
5 load port control unit
6 aligner
7 buffer tool
8 transport chamber
9 wafer transport apparatus
10 gas return path,
11 processing chamber
12, 12-1 load lock chamber
13 FFU
14 chemical filter
15 fan
16 gas supplying means
17 vacant transport robot
18 finger
18*a* holding finger
18*b* purge part
18*c* main body
19 FOUP
19-1 lid
19-2 purge port
20, 20*a*, 20*b*, 20-1 load port
21 stage
21*a* purge nozzle
22 port opening
23 FIMS door
24 stage drive unit
24*a* motor
24*b* ball screw mechanism
25 FIMS door elevating lowering unit
26 frame
27 shield plate
28 shield plate elevating/lowering unit
29 nozzle
30, 30-1, 30-1*a*, 30-1*b*, 30-2 transport robot
31 base
31*a* base cover
32, 32 body part
32*a* body frame
32*b* body cover
33*c* bracket
33, 45 elevating/lowering mechanism
33*a* ball screw mechanism
33*b* motor
34, 34' first arm
35, 35' second arm
36 motor
37 joint
38 tube member
39 control unit
40, 40*a*, 40*b*, 40-1, 40-1*a*, 40-1*b*, 40-2 aligner
41 temporary wafer placing base
42 top plate
43 X-axis driving mechanism
43*a* slide guide
43*b* ball screw mechanism

44 Y-axis driving mechanism
44*a* slide guide
44*b* ball nut
44*c* motor
46 spindle
46*a* adsorption hole
47 bottom plate
48 spindle driving motor
49 line sensor
49*a* light projector
49*b* light receiver
50 cover
51 replacement container
52 nozzle
53 opening
54 lid
54*a* gap
54*b* hinge
55 shower plate
55*a* upper member
55*b* lower member
55*c* through hole (ejection port)
55*d* flow path
56, 88 space
57 column
58 notch
59 elevating/lowering mechanism
59*a* linear guide
59*b* air cylinder
60, 60-1, 60-2, 60-3 buffer tool
61, 61' container
62, 62-1, 62 shelf plate
63, 63' opening
64, 64' shutter
65 nozzle
66 piping
67, 67 air cylinder
68 main control unit
69 flow path
70 table
71 column
72 shelf member
72*a* column portion
72*b* shelf portion
73 ejection port
74 filter
75 linear motion arm
76 computer
77 cassette
78 elevating/lowering mechanism
79 cover
80*a*, 80*b* opening
81 shutter mechanism
82 nozzle
83 filter
84 motor
85 shaft
86 drive source
87, 87-1 shower plate
89 joint.
90 vacant container
91 supporting member
92, 94 opening
93, 95 gate valve
96 exhaust pipe
97, 99 valve
98 piping
100 load lock control unit.
101 nozzle
A, A-1, A-2 processing system
W wafer

The invention claimed is:

1. A transport apparatus, comprising:

an FFU for supplying clean air to a mini-environment space;

two load ports each with an atmosphere replacing function for positioning a hermetically-sealed container configured to house a semiconductor wafer and for replacing an inside of the hermetically-sealed container with an inert gas atmosphere;

an aligner having an atmosphere replacing function for holding the semiconductor wafer and for replacing the atmosphere on a surface to be processed of the semiconductor wafer, two transport robots with an atmosphere arranged at a predetermined interval, each for holding the semiconductor wafer, and each for replacing an atmosphere on a surface to be processed of the semiconductor wafer, and each equipped with a finger having a holding part that holds the semiconductor wafer and a purge part configured to spray the inert gas toward the surface to be processed of the semiconductor wafer; and a buffer tool with an atmosphere replacing function arranged at a position between the two transport robots so as to face to the two transport robots;

wherein the buffer tool includes a buffer tool opening accessible by a corresponding one of the two transport robots and a shutter operably connected to a hinge so that the shutter swings about the hinge between an open position and a closed position configured to close the buffer tool opening.

2. The transport apparatus according to claim 1, wherein the buffer tool includes a nozzle for ejecting the inert gas.

3. The transport apparatus according to claim 2, wherein the buffer tool includes a buffer control unit, and the buffer control unit increases a flow rate of the inert gas ejected from the nozzle while the buffer tool opening is opened.

4. The transport apparatus according to claim 1, wherein the buffer tool includes a shower plate above a shelf plate, and the shower plate ejects an inert gas onto the surface to be processed of the semiconductor wafer placed on the shelf plate.

5. The transport apparatus according to claim 1, wherein the transport apparatus further includes a load lock chamber with an atmosphere replacing function, and the load lock chamber with an atmosphere replacing function includes a shelf plate for placing the semiconductor wafer, a first opening for communicating an internal space of the load lock chamber with an atmosphere replacing function and a mini-environment space, a second opening for communicating the internal space of the load lock chamber with an atmosphere replacing function and an internal space of a transport chamber, a first lid member configured to close the first opening, and, a second lid member configured to close the second opening.

6. The transport apparatus according to claim 5, wherein a shower plate of the load lock chamber ejects the inert gas onto the surface to be processed of the semiconductor wafer placed on the shelf plate.

7. The transport apparatus according to claim 5, wherein the load lock chamber includes a plurality of shelf plates for semiconductor wafers wherein each shelf plate of the plurality of shelf plates is spaced in a vertical direction a predetermined distance from one or more adjacent shelf plates and the plurality of shelf plates are vertically aligned, and the shower plate is arranged above a corresponding semiconductor wafer arranged on a corresponding shelf plate.

8. The transport apparatus according to claim 1, wherein the aligner has a spindle that rotates the semiconductor wafer horizontally and a line sensor that is arranged so as to sandwich a peripheral portion of the semiconductor wafer from below and above, wherein the aligner further has a shower plate configured to eject the inert gas toward the surface to be processed of the semiconductor wafer held on the spindle, the shower plate having a notch at a position through which an optical axis of the line sensor passes.

9. A transporting apparatus according to claim 2, wherein the buffer tool is provided above the aligner, and wherein the transporting apparatus is configured so that the semiconductor wafer taken out of one load port of the two load ports by one transport robot of the two transport robots is transported to the aligner to be aligned to an accurate position by the aligner, and then subsequently transported to the load lock chamber by the one transport robot, and after the semiconductor wafer is processed, the semiconductor wafer is taken out of the load lock chamber and transported to the buffer tool by the one transport robot, and subsequently the semiconductor wafer that has been processed is taken out of the buffer tool by the other transport robot of the two transport robots.

* * * * *